(12) United States Patent
Li

(10) Patent No.: US 11,804,065 B2
(45) Date of Patent: Oct. 31, 2023

(54) DISPLAY APPARATUS AND SIGNAL RECOGNITION METHOD THEREOF, AND VISIBLE LIGHT COMMUNICATION DEVICE

(71) Applicants: BEIJING BOE TECHNOLOGY DEVELOPMENT CO., LTD., Beijing (CN); BOE TECHNOLOGY GROUP CO., LTD., Beijing (CN)

(72) Inventor: Wenbo Li, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/793,553

(22) PCT Filed: May 26, 2021

(86) PCT No.: PCT/CN2021/096022
§ 371 (c)(1),
(2) Date: Jul. 18, 2022

(87) PCT Pub. No.: WO2021/238972
PCT Pub. Date: Dec. 2, 2021

(65) Prior Publication Data
US 2023/0103363 A1 Apr. 6, 2023

(30) Foreign Application Priority Data
May 26, 2020 (CN) .......................... 202010457687.7

(51) Int. Cl.
*G06V 40/13* (2022.01)
*G06V 10/147* (2022.01)
(Continued)

(52) U.S. Cl.
CPC ...... *G06V 40/1318* (2022.01); *G02F 1/13338* (2013.01); *G02F 1/133512* (2013.01); *G06V 10/147* (2022.01)

(58) Field of Classification Search
CPC .. G06V 40/13; G06V 40/1318; G06V 10/147; G02F 1/13338; G02F 1/133512
See application file for complete search history.

(56) References Cited

U.S. PATENT DOCUMENTS 7,834,940 B2 11/2010 Uemoto
10,935,421 B2 * 3/2021 Pang ................. G06V 40/1318
(Continued)

FOREIGN PATENT DOCUMENTS

CN 106022292 A 10/2016
CN 206058227 U 3/2017
(Continued)

OTHER PUBLICATIONS

First Office Action for Chinese Patent Application No. 202010457687.7 issued by the Chinese Patent Office dated Apr. 27, 2023.

*Primary Examiner* — Koosha Sharifi-Tafreshi
(74) *Attorney, Agent, or Firm* — IP & T GROUP LLP

(57) ABSTRACT

A display apparatus includes display recognition units and a first processing device. Each of the display recognition units includes one or more sub-pixels and a photosensitive sensing device. The photosensitive sensing device is configured to convert reflected light of light emitted from at least one sub-pixel into a first electrical signal, and convert external light containing information entering from a display side into a second electrical signal. The first processing device is connected to photosensitive sensing devices of the display recognition units, and configured to obtain a texture image according to first electrical signals output by the photosensitive sensing devices, and determine the information con-
(Continued)

tained in the external light according to a second electrical signal output by at least one photosensitive sensing device.

19 Claims, 20 Drawing Sheets

(51) Int. Cl.
*G02F 1/1333* (2006.01)
*G02F 1/1335* (2006.01)

(56) References Cited

U.S. PATENT DOCUMENTS

| | | | |
|---|---|---|---|
| 10,963,661 B2 * | 3/2021 | Zhou | G06V 40/1318 |
| 2018/0151638 A1 | 5/2018 | Lou et al. | |
| 2018/0173926 A1 | 6/2018 | Wang et al. | |

FOREIGN PATENT DOCUMENTS

| | | |
|---|---|---|
| CN | 206907046 U | 1/2018 |
| CN | 110426875 A | 11/2019 |
| CN | 111626195 A | 9/2020 |

\* cited by examiner

DISPLAY APPARATUS AND SIGNAL RECOGNITION METHOD THEREOF, AND VISIBLE LIGHT COMMUNICATION DEVICE

CROSS-REFERENCE TO RELATED APPLICATIONS

This application is a national phase entry under 35 USC 371 of International Patent Application No. PCT/CN2021/096022 filed on May 26, 2021, which claims priority to Chinese Patent Application No. 202010457687.7 filed on May 26, 2020, which are incorporated herein by reference in their entirety.

TECHNICAL FIELD

The present disclosure relates to the field of display technologies, and in particular, to a display apparatus and a signal recognition method thereof, and a visible light communication device.

BACKGROUND

With the development of display technologies, display apparatuses are applied to various products. For example, the display apparatus is used to display a password keyboard in an access control system of a smart home, and fingerprint recognition technology may also be applied to the access control system for unlocking, so as to solve a problem that a door lock in a traditional access control system cannot be unlocked due to forgetting to take the key, or accidentally losing the key, etc., and a problem of abnormal unlocking such as forgery or theft of the key. Therefore, security of the access control system may be improved.

SUMMARY

In an aspect, a display apparatus is provided. The display apparatus includes a plurality of display recognition units and a first processing device. Each display recognition unit of the display recognition units includes one or more sub-pixels and a photosensitive sensing device. The photosensitive sensing device is configured to convert reflected light of light emitted from at least one sub-pixel into a first electrical signal, and is further configured to convert external light containing information that enters from a display side of the display apparatus into a second electrical signal. The first processing device is connected to a plurality of photosensitive sensing devices of the plurality of display recognition units. The first processing device is configured to obtain a texture image according to first electrical signals output by the plurality of photosensitive sensing devices. The first processing device is further configured to determine the information contained in the external light according to a second electrical signal output by at least one photosensitive sensing device.

In a possible implementation manner, the first processing device is configured to determine the information contained in the external light according to a magnitude and/or a frequency of the second electrical signal.

In another possible implementation manner, the first processing device is further configured to determine whether an electrical signal received thereby is the first electrical signal or the second electrical signal according to a preset threshold interval.

In yet another possible implementation manner, the plurality of display recognition units are arranged at intervals; or the display recognition unit includes a plurality of sub-pixels, and a part of the plurality of sub-pixels is shared by another display recognition unit.

In yet another possible implementation manner, the photosensitive sensing device includes one photosensitive sensor, the photosensitive sensor is configured to convert the reflected light of the light emitted from the at least one sub-pixel into the first electrical signal, and is further configured to convert the external light entering from the display side of the display apparatus into the second electrical signal. Alternatively, the photosensitive sensing device includes two photosensitive sensors; one photosensitive sensor of the two photosensitive sensors is configured to convert the reflected light of the light emitted from the at least one sub-pixel into the first electrical signal, and another photosensitive sensor of the two photosensitive sensors is configured to convert the external light entering from the display side of the display apparatus into the second electrical signal.

In yet another possible implementation manner, the display recognition unit includes a plurality of sub-pixels. In a case where the photosensitive sensing device includes the two photosensitive sensors, the another photosensitive sensor of the two photosensitive sensors includes a plurality of photosensitive elements. The plurality of photosensitive elements are in one-to-one correspondence with at least two sub-pixels of the sub-pixels in the display recognition unit, or the plurality of photosensitive elements are in one-to-one correspondence with at least one sub-pixel of the sub-pixels in the display recognition unit and the one photosensitive sensor of the two photosensitive sensors.

In yet another possible implementation manner, the display recognition unit includes at least three colors of sub-pixels.

In yet another possible implementation manner, the display apparatus further includes: a plurality of first gate lines, a plurality of second gate lines, a plurality of third gate lines, one or more first output signal lines and one or more second output signal lines. The photosensitive sensing device includes one photosensitive sensor, the photosensitive sensor is connected to a first gate line of the first gate lines and a first output signal line of the one or more first output signal lines, and a sub-pixel of the one or more sub-pixels is connected to a second gate line of the second gate lines. The photosensitive sensing device includes two photosensitive sensors, one photosensitive sensor of the two photosensitive sensors is connected to a first gate line of the first gate lines and a first output signal line of the one or more first output signal lines, another photosensitive sensor of the two photosensitive sensors is connected to a third gate line of the third gate lines and a second output signal line of the one or more second output signal lines, and a sub-pixel of the one or more sub-pixels is connected to a second gate line of the second gate lines.

In yet another possible implementation manner, the display apparatus further includes a substrate. A sub-pixel of the one or more sub-pixels includes a light-emitting device, and the light-emitting device and the photosensitive sensing device are disposed on a same side of the substrate.

In yet another possible implementation manner, the photosensitive sensing device include a photosensitive sensing layer; and the light-emitting device includes a light-emitting functional layer. The light-emitting functional layer and the photosensitive sensing layer in the photosensitive sensing device are located on a same layer.

In yet another possible implementation manner, the display apparatus further includes first light-shielding patterns. A first light-shielding pattern of the first light-shielding patterns and the photosensitive sensing device are located on a same surface of the substrate, and an orthographic projection of the first light-shielding pattern on the substrate is located between an orthographic projection of the light-emitting device on the substrate and an orthographic projection of the photosensitive sensing device on the substrate. A distance between a surface of the first light-shielding pattern proximate to the substrate and the surface of the substrate is less than or equal to a distance between a surface of the light-emitting functional layer of the light-emitting device proximate to the substrate and the substrate. A distance between a surface of the first light-shielding pattern away from the substrate and the surface of the substrate is greater than or equal to a distance between a surface of the light-emitting functional layer of the light-emitting device away from the substrate and the surface of the substrate.

In yet another possible implementation manner, the display apparatus further includes second light-shielding patterns. A second light-shielding pattern of the second light-shielding patterns is disposed on a side of the first light-shielding pattern away from the substrate, and an orthographic projection of the second light-shielding pattern on the substrate is located between the orthographic projection of the photosensitive sensing device on the substrate and the orthographic projection of the light-emitting device on the substrate.

In yet another possible implementation manner, the display apparatus further includes a backlight module. The backlight module is configured to provide a light source for the one or more sub-pixels, so that the photosensitive sensing device receives the reflected light of the light emitted from the at least one sub-pixel, and the backlight module is further configured to stop providing the light source for the one or more sub-pixels during a process of receiving the external light entering from the display side of the display apparatus by the photosensitive sensing device.

In yet another possible implementation manner, the display apparatus further includes: a substrate; and third light-shielding patterns. A third light-shielding pattern of the third light-shielding patterns is disposed between the substrate and the photosensitive sensing device, and an orthographic projection of the photosensitive sensing device on the substrate is within an orthographic projection of the third light-shielding pattern on the substrate.

In a second aspect, a visible light communication device is provided. The visible light communication device includes the display apparatus according to any one of the above embodiments.

In a possible implementation manner, the visible light communication device further includes a second processing device configured to control at least one display recognition unit in the display apparatus to transmit an optical signal containing information; and/or an illuminant and a third processing device, the third processing device being configured to control the illuminant to transmit another optical signal containing information.

In another possible implementation manner, the visible light communication device is a communication terminal or a lock body.

In a third aspect, a signal recognition method of a display apparatus is provided, and the signal recognition method includes:

receiving, by each photosensitive sensing device of a plurality of photosensitive sensing devices in a plurality of display recognition units, reflected light of light emitted from at least one sub-pixel, converting, by the photosensitive sensing device, the reflected light into a first electrical signal, and outputting, by the photosensitive sensing device, the first electrical signal to a first processing device; or receiving, by a photosensitive sensing device in at least one display recognition unit of the display recognition units, external light containing information that enters from a display side of the display apparatus, converting, by the photosensitive sensing device, the external light into a second electrical signal, and outputting, by the photosensitive sensing device, the second electrical signal to the first processing device; and receiving, by the first processing device, first electrical signals output by the plurality of photosensitive sensing devices, and generating, by the first processing device, a texture image according to the first electrical signals; or determining, by the first processing device, the information contained in the external light according to the second electrical signal output by the photosensitive sensing device.

In yet another possible implementation manner, the display apparatus includes a backlight module. If the backlight module is turned on, the photosensitive sensing devices in the plurality of display recognition units each receive the reflected light of the light emitted from the at least one sub-pixel; and if the backlight module is turned off, the photosensitive sensing device in the at least one display recognition unit receives the external light entering from the display side of the display apparatus.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals to which the embodiments of the present disclosure relate.

FIGS. 11A to 11D are sectional views of some liquid crystal display apparatuses provided by embodiments of the present disclosure;

DETAILED DESCRIPTION

Figure 1A:
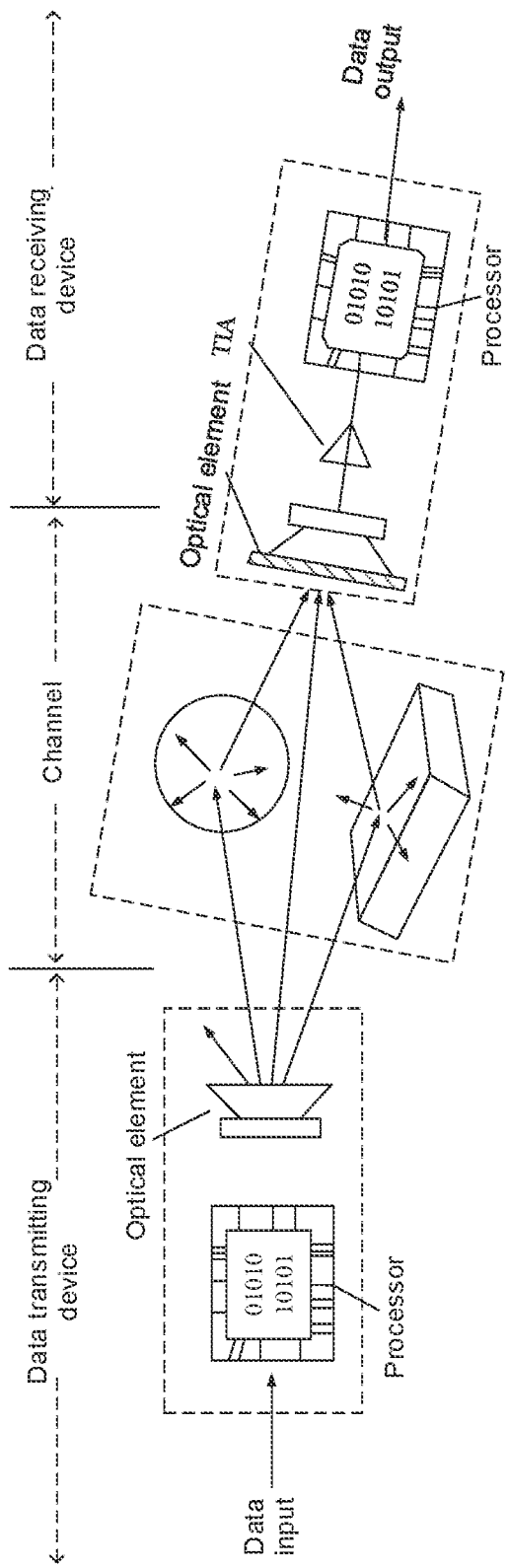
FIG. 1A is a structural diagram of a visible light communication system provided by embodiments of the present disclosure.

Technical solutions in embodiments of the present disclosure will be described clearly and completely below with reference to accompanying drawings in the embodiments of the present disclosure. Obviously, the described embodiments are merely some but not all embodiments of the present disclosure. All other embodiments obtained by a person of ordinary skill in the art based on the embodiments of the present disclosure without paying any creative effort shall be included in the protection scope of the present disclosure.

Unless the context requires otherwise, the term "comprise" and other forms thereof such as the third-person singular form "comprises" and the present participle form "comprising" throughout the specification and the claims are construed as an open and inclusive meaning, i.e., "including, but not limited to". In the description of the specification, the terms such as "one embodiment", "some embodiments", "exemplary embodiments", "example", "specific example" and "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, features defined with "first" or "second" may explicitly or implicitly include one or more of the features. In the description of the embodiments of the present disclosure, the term "a plurality of/the plurality of" means two or more unless otherwise specified.

In the description of some embodiments, the terms "coupled", "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, depending on the context, the phrase "if it is determined that" or "if [a stated condition or event] is detected" is optionally construed as "in a case where it is determined that", "in response to determining that", "in a case where [the stated condition or event] is detected" or "in response to detecting [the stated condition or event]".

The phase "applicable to" or "configured to" as used herein means an open and inclusive language, which does not exclude devices that are applicable to or configured to perform additional tasks or steps.

In addition, the phrase "based on" as used is meant to be open and inclusive, since a process, step, a calculation or other action that is "based on" one or more of the stated conditions or values may, in practice, be based on additional conditions or values beyond those stated.

As used herein, the term such as "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and regions are enlarged for clarity. Therefore, variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Biometric recognition technology is a technology that identifies an individual by using inherent physiological characteristics and behavioral characteristics of a human body through a close combination of a computer and high-tech means such as optic, acoustic, biological sensors and principles of biostatistics. The physiological characteristics may be fingerprint, face image, iris, etc., and the behavioral characteristics may be handwriting, voice, gait, etc. At present, fingerprint recognition technology and face recognition technology are used most widely. The fingerprint recognition is used to, for example, realize functions of unlocking, payment, attendance, etc., and the unlocking function is applied to products such as mobile phones and access control systems.

Visible light communication (VLC) technology refers to a communication manner in which an optical signal is directly transmitted in air by using light in a visible light band as an information carrier without transmission media of a wired channel such as an optical fiber. For example, devices using the VCL technology may transmit information by using an optical signal with high-speed light-dark flicker emitted by a light source such as a fluorescent illuminant or a light emitting diode, and human eyes do not recognize the high-speed flicker of the optical signal. The VCL technology has advantages of greenness, low carbon, no electromagnetic radiation, communication through the optical signal, high transmission power, communication of energy consumption close to zero, no communication dead zone, wide transmission frequency band, large communication capacity, good confidentiality, strong anti-interference capability, and no need for radio spectrum certification. As a result, a secure information space with anti-interference and anti-interception capability may be quickly constructed.

In the related art, considering an access control system as an example, a door lock in the access control system is provided with a fingerprint recognition function, and a sensor module in the door lock used to realize the fingerprint recognition function is, for example, a piezoelectric ultrasonic sensor. However, some users with a relatively light fingerprint require multiple recognition when unlocking the door lock, which takes a relatively long time required to unlock the door lock. There may even be a possibility that the fingerprint does not be recognized and the door lock only has the fingerprint recognition function. Therefore, in a case where the door lock in the related art only has the fingerprint recognition function, the door lock has a single function and is inconvenient to use.

FIG. 1A shows a visible light communication (VLC) system provided by embodiments of the present disclosure, which transmits information by using the VLC technology. The visible light communication system may include a data transmitting terminal device and a data receiving terminal device. The data transmitting terminal device is configured to transmit an optical signal (also referred to as a visible light signal) containing information to be transmitted, and the data receiving terminal device is configured to receive the optical signal and recognize the information contained in the received optical signal. The optical signal is transmitted between the data transmitting terminal device and the data receiving terminal device through a channel. The channel is a visible light channel, for example, air.

For example, referring to FIG. 1A, the data transmitting terminal device may include, for example, a data input interface, a processor and an optical element. The data input interface is configured to receive a signal containing information (i.e., data). In an example, the received signal may be a binary bit stream, i.e., a digital signal ("0101010101" as shown in FIG. 1A). In another example, the received signal may be an analog signal. In this case, the data transmitting terminal device may further include an analog-to-digital converter (ADC), and the ADC may convert the analog signal received by the data input interface into a digital signal. The processor is configured to code, modulate and the like the digital signal containing information. In some examples, the processor is a digital signal processor (DSP). The optical element is configured to emit an optical signal under driving of the modulated signal.

The data receiving terminal device may include, for example, an optical element and a processor (e.g., including a DSP). The optical element is configured to convert the received optical signal into an electrical signal. The processor is configured to demodulate, decode and the like the electrical signal output by the optical element. The data receiving terminal device may further include a trans-impedance amplifier (TIA), a data output interface, etc. The trans-impedance amplifier is located between the optical element and the processor, so that the processor processes the electrical signal output by the TIA. The data output interface is configured to output the processed signal.

Embodiments of the present disclosure provide a visible light communication (VLC) device. The visible light communication device may be used as the data receiving terminal device in the visible light communication system.

The visible light communication device may be a communication terminal, for example, a telephone, a mobile phone, a personal digital assistant (PDA), a navigator, a vehicle, a home appliance, and an information search device (e.g., a business search device of a department such as an e-government department, a bank, a hospital or an electric power department), etc. In addition, alternatively, the visible light communication device may be a lock body.

Figure 1B:
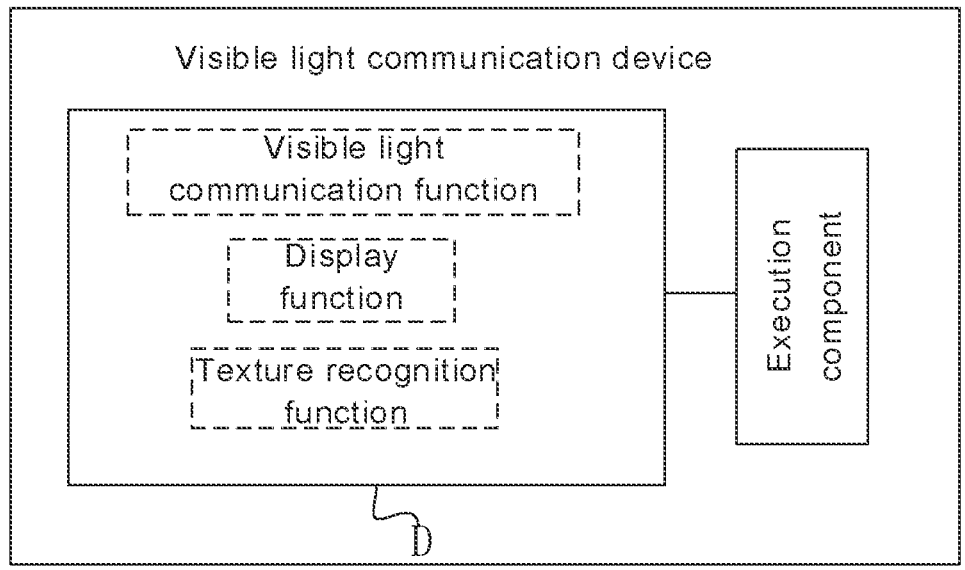
FIG. 1B is a structural diagram of a visible light communication device provided by embodiments of the present disclosure.

In addition to the visible light communication function, the visible light communication device may further have, for example, a texture recognition (e.g., fingerprint recognition) function by using the biometric recognition technology. In addition, the visible light communication device may further have a display function. In order to realize these functions, referring to FIG. 1B, the visible light communication device includes a display apparatus D, i.e., an apparatus with a display function. In this case, the display apparatus may display an image. The display apparatus is further integrated with the texture recognition function, and may output a texture recognition result by using the texture recognition function. The display apparatus is further integrated with the visible light communication function, and may output a recognized information (referred to as an optical communication information, i.e., the information transmitted by the data transmitting terminal device) by using the visible light communication function. The visible light communication device may further include an execution component, and the execution component may execute respective operations according to the texture recognition result and/or the optical communication information output by the display apparatus.

For example, the visible light communication device is a mobile phone, and the execution component may be a processor (e.g., central processing unit (CPU)) in the mobile phone. When the visible light communication device is used for unlocking, an unlocking manner may be realized by the texture recognition technology or by the visible light communication technology. For example, the processor may determine that the texture identification result output by the display apparatus matches a preset texture, and execute an unlocking or payment operation, and may further control the display apparatus to display an interface after the unlocking or payment operation. For another example, the optical communication information output by the display apparatus may be a password information. The processor determines that the received password information matches a preconfigured password, and executes the unlocking or payment operation, and may further control the display apparatus to display an interface after the unlocking or payment operation. For yet another example, the optical communication information output by the display apparatus may be a picture, a voice, or a video. The processor may control the display apparatus to display the picture or the video, and the processor may also control an audio circuit, so that the audio circuit drive a speaker to output the voice.

For another example, the visible light communication device is a lock body, and the lock body may be the door lock, the access control system, or a lock on a device such as a trunk or a safe. An execution component in the lock body may include a processor (e.g., a microprocessor) and a lock tongue movement mechanism. For example, the processor may determine that the texture recognition result output by the display apparatus matches a preset texture, and control the lock tongue movement mechanism to execute an unlocking operation. For another example, the processor may determine that the received password information matches a preconfigured password, and control the lock tongue movement mechanism to execute an unlocking operation.

Embodiments of the present disclosure provide a display apparatus. In order to realize the texture recognition (e.g., fingerprint recognition) function and the visible light communication function of the display apparatus, an optical signal is required to be converted into an electrical signal, and then the electrical signal is processed.

The display apparatus may be a liquid crystal display (LCD), an organic light-emitting diode (OLED) display apparatus, a quantum dot light-emitting diode (OLED) display apparatus or a tiny light-emitting diode (LED including mini LED or micro LED) display apparatus.

Figure 2:
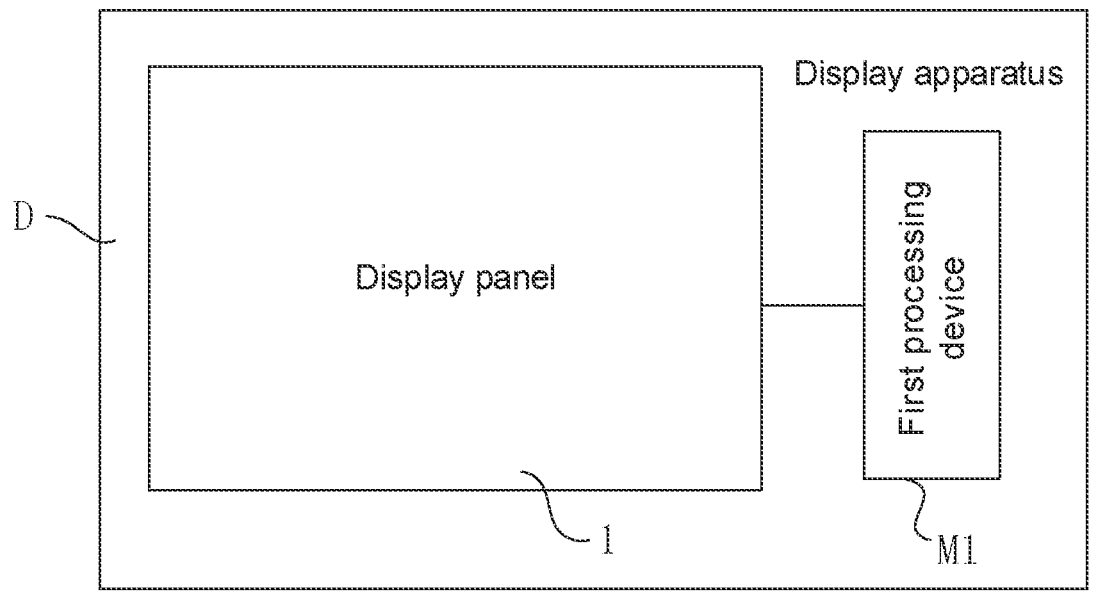
FIG. 2 is a structural diagram of a display apparatus in a visible light communication device provided by embodiments of the present disclosure.

In some embodiments, as shown in FIG. 2, the display apparatus D includes a display panel 1 and a first processing device M1. It is not limited thereto, for example, the display apparatus D may further include a driving circuit board connected to the display panel, etc. The driving circuit board is configured to provide an electrical signal for the display panel, so as to drive the display panel to display an image.

As shown in FIGS. 3, 4A, 4B and 4C, the display apparatus includes a plurality of display recognition units 10. In this embodiment, for example, the plurality of display recognition units 10 are disposed in the display panel 1. A display recognition unit 10 (e.g., each display recognition unit of the plurality of display recognition units) includes at least one sub-pixel and a photosensitive sensing device 100. The plurality of display recognition units 10 may be some of display recognition units in the display panel 1, or may be all display recognition units in the display panel 1.

A display recognition unit 10 includes at least one sub-pixel, that is, the display recognition unit 10 includes a single sub-pixel or a plurality of sub-pixels. The term "a plurality of/the plurality of" means two or more. The plurality of sub-pixels may include, for example, a first color sub-pixel P1, a second color sub-pixel P2 and a third color sub-pixel P3. The first color, the second color and the third color are, for example, three primary colors, and the three primary colors are, for example, red, green and blue.

Figure 3:
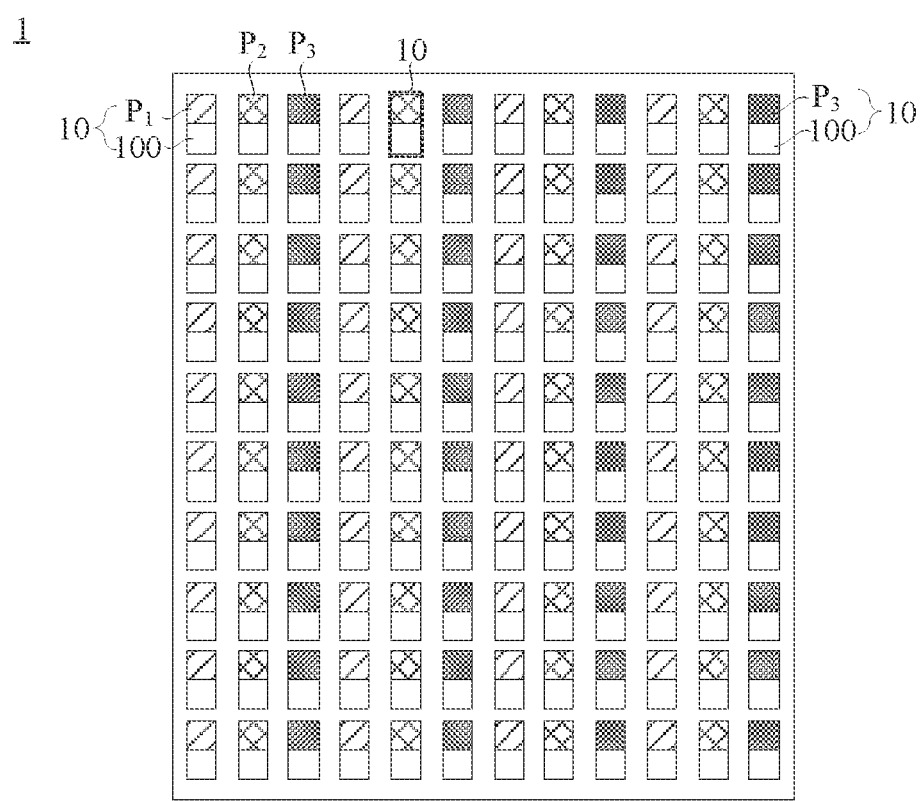
FIG. 3 is a structural diagram of a display panel in a display apparatus provided by embodiments of the present disclosure.

For example, as shown in FIG. 3, a (e.g., each) display recognition unit 10 includes a single sub-pixel and a photosensitive sensing device 100. For example, the plurality of display recognition units 10 are arranged in an array. Of display recognition units 10 located in a same row, colors of sub-pixels of two adjacent display recognition units are different, and colors of sub-pixels of display recognition units 10 located in a same column are the same.

Figure 4A:
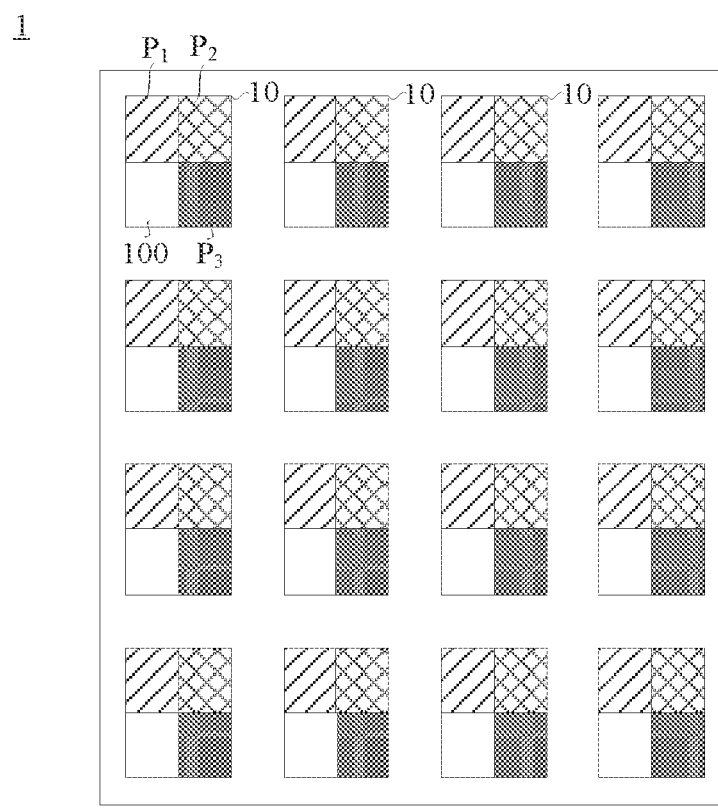
FIG. 4A is a structural diagram of a display panel in another display apparatus provided by embodiments of the present disclosure.
Figure 4B:
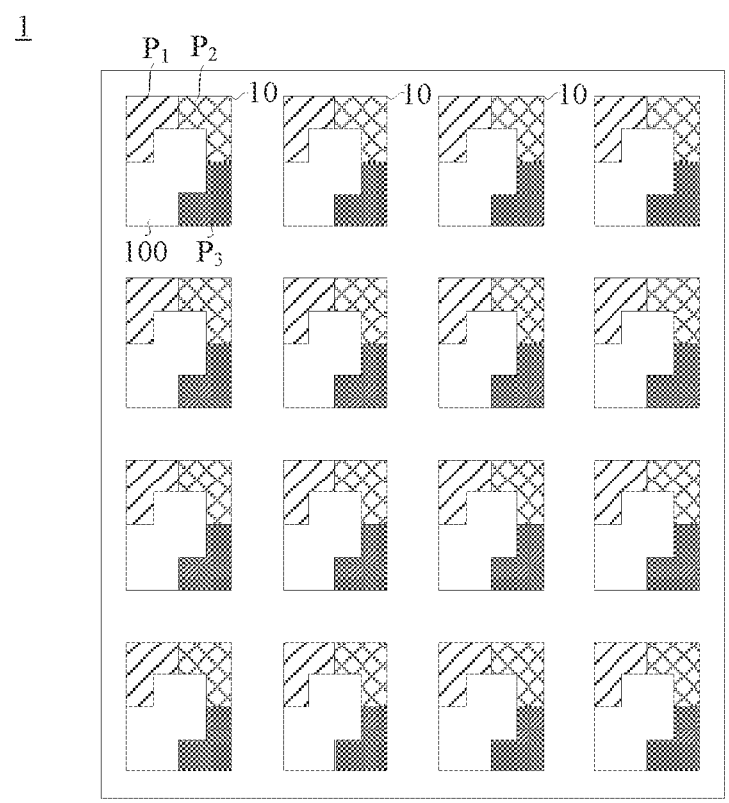
FIG. 4B is a structural diagram of a display panel in yet another display apparatus provided by embodiments of the present disclosure.

For another example, as shown in FIGS. 4A and 4B, a (e.g., each) display recognition unit 10 includes sub-pixels of three colors, for example, includes three sub-pixels $P_1$, $P_2$ and $P_3$ and a photosensitive sensing device 100. Referring to FIG. 4A, an area of a region occupied by the photosensitive sensing device 100 may be approximately equal to an area of a region occupied by a sub-pixel (i.e., a light-emitting area of the sub-pixel). Referring to FIG. 4B, the area of the region occupied by the photosensitive sensing device 100 may be greater than the area of the region occupied by the sub-pixel.

Figure 4C:
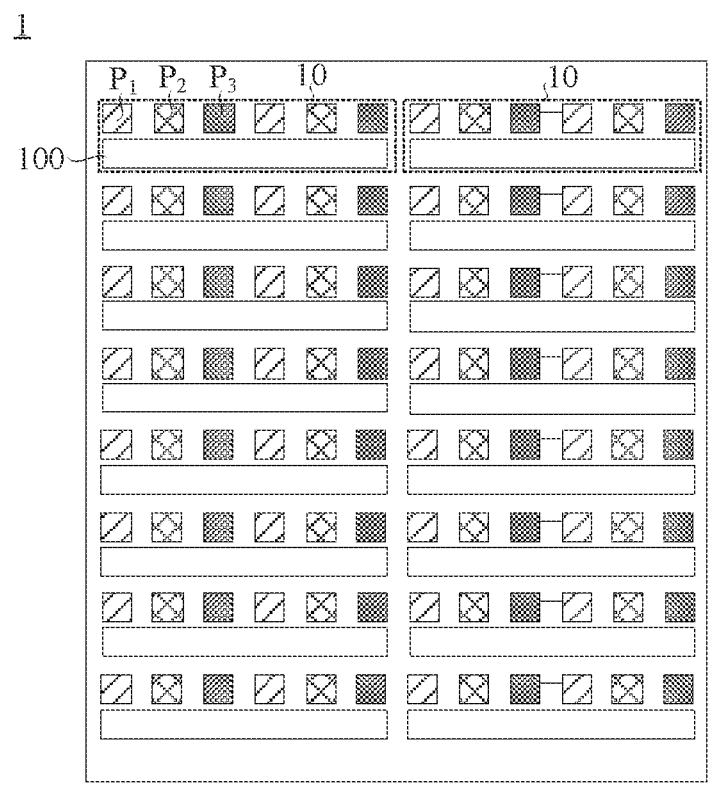
FIG. 4C is a structural diagram of a display panel in yet another display apparatus provided by embodiments of the present disclosure.

For yet another example, as shown in FIG. 4C, a (e.g., each) display recognition unit 10 includes six sub-pixels and a photosensitive sensing device 100. The six sub-pixels may include two sub-pixels $P_1$, two sub-pixels $P_2$ and two sub-pixels $P_3$. In this way, the display recognition unit 10 may include the sub-pixels of three colors.

In a display recognition unit 10, a photosensitive sensing device 100 is configured to convert reflected light of light emitted from at least one sub-pixel (e.g., each sub-pixel in the display recognition unit 10) into a first electrical signal, and is further configured to convert external light containing information that enters from a display side of the display apparatus into a second electrical signal.

The photosensitive sensing device 100 may convert the optical signal into an electrical signal, and then information that may reflect parameter(s) of the optical signal is obtained by processing the electrical signal subsequently. The parameter(s) of the optical signal include at least one of an amplitude (i.e., intensity), a phase, and a frequency of the optical signal.

Figure 5A:
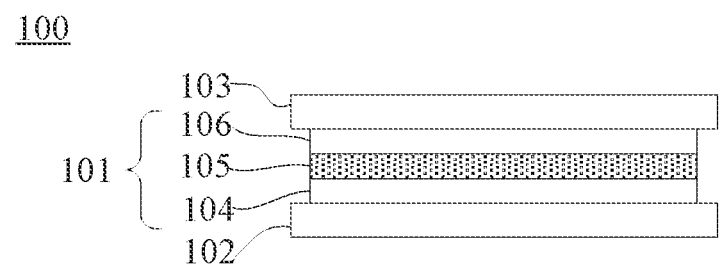
FIG. 5A is a structural diagram of a longitudinal section of a photosensitive sensing layer of a photosensitive sensing device provided by embodiments of the present disclosure.
Figure 5B:
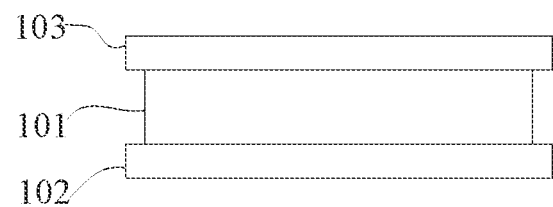
FIG. 5B is a structural diagram of a longitudinal section of a photosensitive sensing layer of another photosensitive sensing device provided by embodiments of the present disclosure.

Referring to FIGS. 5A and 5B, the photosensitive sensing device 100 includes a photosensitive sensing layer 101, and a first electrode (also referred to as a first electrode layer) 102 and a second electrode (also referred to as a second electrode layer) 103 that are located on two opposite sides of the photosensitive sensing layer. The photosensitive sensing device 100 may include at least one photosensitive sensor. In a case where the photosensitive sensing device 100 includes a plurality of photosensitive sensors, the photosensitive sensing device 100 includes a corresponding number of first electrodes 102, the corresponding number of photosensitive sensing layers 101 and the corresponding number of second electrodes 103. For example, if the photosensitive sensing device 100 includes two photosensitive sensors, the photosensitive sensing device 100 includes a first electrode 102, a photosensitive sensing layer 101 and a second electrode 103 of each photosensitive sensor. The first electrodes 102 of the photosensitive sensors are in a same pattern layer, the photosensitive sensing layers 101 of the photosensitive sensors are in a same pattern layer, and the second electrodes 103 of the photosensitive sensors may be a one-piece structure.

As shown in FIG. 5A, a type of the photosensitive sensing device 100 may be a positive intrinsic negative (PIN) photodiode. As shown in FIG. 5A, the photosensitive sensing device 100 includes a first semiconductor layer 104, a second semiconductor layer 105 and a third semiconductor layer 106 that are stacked. The first semiconductor layer 104, the second semiconductor layer 105 and the third semiconductor layer 106 may be a P-type semiconductor layer, an intrinsic semiconductor layer, and an N-type semiconductor layer, respectively; alternatively, these layers may be an N-type semiconductor layer, a P-type semiconductor layer, and an intrinsic semiconductor layer, respectively. As shown in FIG. 5B, the first electrode 102 serves as a sensing electrode layer, and the second electrode 103 serves as a driving electrode layer. Materials of the sensing electrode layer and the driving electrode layer are, for example, the same, and are, for example, a conductive material such as nano-silver, graphene, carbon nanotube, aluminum, chromium, or copper. The above metal materials may be a simple metal or an alloy, which is not limited in the present disclosure. The photosensitive sensing layer 101 may be a photoelectric conversion layer, and the photoelectric conversion layer is made of, for example, a perovskite material. The perovskite material is, for example, an organic-inorganic lead halide perovskite material, and the organic-inorganic lead halide perovskite material is, for example, $CH_3NH_3PbI_3$.

The photosensitive sensing device 100 is used for converting the reflected light of the light emitted from the at least one sub-pixel into the first electrical signal. When the light emitted from the sub-pixel reaches a texture of a hand (the texture of the hand may be a fingerprint of a finger or a palmprint, etc., and the texture of the hand is, for example, the fingerprint below), due to presence of valleys and ridges of the fingerprint, the light emitted from the sub-pixel is reflected at different positions. As a result, a light intensity of the reflected light is different. After receiving the light reflected by the fingerprint, the photosensitive sensing device 100 converts the reflected light into the first electrical signal. Subsequently, the first processing device in the visible light communication device may process the first electrical signal to obtain a texture image embodying the fingerprint information. The execution component in the visible light communication device may realize the fingerprint recognition by comparing whether the texture image obtained according to the first electrical signal is consistent with a texture image stored in advance.

The photosensitive sensing device 100 is further used for converting the external light containing the information that enters from the display side of the display apparatus into the second electrical signal. The external light is a visible light signal that contains the optical communication information and is transmitted by the data transmitting terminal device. Since the external light is not the reflected light and may directly enter from the display side of the display apparatus, for the light communication device served as the data receiving terminal device, the external light belongs to light from outside and thus the light is referred to as the external light. At least one of an intensity (i.e., amplitude), a phase and a frequency of the external light may be adjusted by the data transmitting terminal device according to the information to be transmitted. For example, the frequency and/or the intensity of the external light may be adjusted. The external light is, for example, light provided by a flashlight on a mobile phone, or light provided by other devices. When receiving the external light, the photosensitive sensing device 100 may convert the external light into the second electrical signal. After being processed, the second electrical signal may embody at least one of the intensity (i.e., amplitude), the phase and the frequency of the external light, for example, may embody the frequency and/or the intensity information of the external light. For example, a magnitude of the second electrical signal corresponds to the intensity of the optical signal, and a frequency of the second electrical signal corresponds to the frequency of the optical signal.

The first processing device M1 in FIG. 2 is connected to photosensitive sensing devices 100 in the plurality of display recognition units 10 (shown in FIG. 3, 4A, 4B or 4C). The first processing device is configured to obtain the texture image according to the first electrical signals output by the photosensitive sensing devices 100. For example, the first processing device generates the texture image according to the first electrical signals output by the plurality of photosensitive sensing devices 100. The first processing device is further configured to determine the information contained in the external light according to the second electrical signal output by at least one photosensitive sensing device. For example, the first processing device determines the information contained in the external light according to the magnitude and/or the frequency of the second electrical signal output by the at least one photosensitive sensing device 100. The first processing device determines the magnitude of the second electrical signal according to a recognition frequency (which may be equal to a flicker frequency of a light source in the data transmitting terminal device, and may be characterized by a transmission rate, such as 1 Gbps). That is, it is determined whether the second electrical signal received every 1/1 G second is at a high level or a low level, thereby generating a binary digital signal.

The first processing device includes, for example, a DSP, one or more CPUs, a microprocessor, an application-specific integrated circuit (ASIC) or an integrated circuit for controlling programs of some embodiments of the present disclosure to be executed. The CPU may be a single-CPU or a multi-CPU. The first processing device herein may refer to one or more devices, circuits or processing cores for processing data (e.g., computer program instructions). In addition, the first processing device and the processor in the execution component may be two independent components, or may be integrated into one component.

Different algorithms are set in the first processing device. An algorithm based on the fingerprint recognition technology is used to process the first electrical signal to obtain the texture image; and another algorithm based on the visible light communication is used to process the second electrical signal to obtain the information contained in the external light. For example, the algorithm based on the visible light communication includes: acquiring the magnitude and/or the frequency of the second electrical signal, the magnitude of the second electrical signal corresponding to the intensity of the external light, and the frequency of the second electrical signal corresponding to the frequency of the external light; and comparing the magnitude and/or the frequency of the second electrical signal and a preset value (the preset value corresponding to the magnitude and/or the frequency of the second electrical signal), so as to determine the information contained in the external light corresponding to the second electrical signal. For example, the information contained in the external light is, for example, password information. In this way, the display apparatus may be unlocked by means of the visible light communication.

The algorithm based on the fingerprint recognition technology and the algorithm based on the visible light communication are relatively mature, which may refer to the prior art and will not be repeated in the present disclosure.

In the display apparatus, the different algorithms correspond to different operating modes. For example, the algorithm based on the fingerprint recognition technology corresponds to a fingerprint recognition mode, and the algorithm based on the visible light communication corresponds to a visible light communication mode. By selecting different operating modes, an operating state of the first processing device may be controlled. For example, in a case where the fingerprint recognition mode is selected, the photosensitive sensing device converts a received optical signal into an electrical signal. In this case, the electrical signal is the first electrical signal, and the first processing device obtains the texture image according to the first electrical signals.

After receiving the optical signal, the photosensitive sensing device does not determine whether the received optical signal is the optical signal reflected by the fingerprint or the external light, and merely converts the optical signal into the electrical signal. The first processing device may determine whether the received electrical signal is the first electrical signal or the second electrical signal according to the received electrical signal, and select an algorithm corresponding to the electrical signal for processing. Alternatively, before the photosensitive sensing device receives the optical signal, the display apparatus is adjusted to the fingerprint recognition mode or the visible light communication mode by other means. The first processing device selects a corresponding algorithm according to the operating mode of the display apparatus, so as to complete the processing of the electrical signal.

In the embodiments of the present disclosure, the plurality of display recognition units in the display apparatus may receive not only the reflected light of the light emitted from the at least one sub-pixel, but also the external light containing the information that enters from the display side of the display apparatus. The plurality of display recognition units converts the reflected light into the first electrical signal, and converts the external light into the second electrical signal, and the first processing device processes the first electrical signals and the second electrical signal, so that the fingerprint recognition function and the visible light communication function are both realized. Compared with display apparatuses that separately have the visible light communication function and the fingerprint recognition function, the display apparatus provided by the embodiments of the present disclosure is integrated with the visible light communication function and the fingerprint recognition function, so that a structure of the display apparatus tends to be simple.

In the embodiments of the present disclosure, the display apparatus includes the plurality of display recognition units and the first processing device, and the display recognition unit includes the photosensitive sensing device. The photosensitive sensing device may convert the reflected light of the light emitted from the at least one sub-pixel into the first electrical signal, and convert the external light entering from the display side of the display apparatus into the second electrical signal. The first processing device may obtain the texture image according to the first electrical signals to realize fingerprint recognition. The first processing device may further obtain the second electrical signal (e.g., the magnitude and the frequency of the second electrical signal) to realize the visible light communication. Therefore, the display apparatus in the present disclosure has both the fingerprint recognition function and the visible light communication function.

As described above, the visible light communication device provided by the embodiments of the present disclosure may be a lock body, which includes the above display apparatus. The display apparatus may be applied to various systems and devices that need to be locked, for example, the access control system, for another example, the trunk, the safe and other devices that require high security. The lock body may realize unlocking through the fingerprint recognition function or the visible light communication function. Therefore, in a case where the display apparatus in the present disclosure is applied to the systems and the devices that need to be unlocked, such as the access control system, the user may unlock by using the fingerprint recognition function. In a case where the fingerprint of the user is relatively light, the user may also unlock by using the visible light communication function. Moreover, security of the visible light communication function for unlocking is high, the password for unlocking is not easily stolen. Therefore, the display apparatus in the present disclosure has many functions, a strong applicability and high security, and is easy to use.

In some embodiments, the first processing device is further configured to determine whether an electrical signal received thereby is the first electrical signal or the second electrical signal according to a preset threshold interval, so that the first processing device may obtain the texture image according to the first electrical signals, and determine the information contained in the external light according to the second electrical signal (e.g., according to the magnitude and/or the frequency of the second electrical signal).

Different threshold intervals, such as a first threshold interval corresponding to the first electrical signal and a second threshold interval corresponding to the second electrical signal, are set in the first processing device. The first processing device determines a threshold interval to which the received electrical signal (including the first electrical signal or the second electrical signal) belongs, and selects an algorithm corresponding to the threshold interval to process the electrical signal. For example, in a case where the electrical signal received by the first processing device belongs to the second threshold interval, the electrical signal is the second electrical signal, and the first processing device uses the algorithm based on the visible light communication to process the second electrical signal.

The threshold interval may be set according to the magnitude or the frequency of the electrical signal.

For example, the frequency of the first electrical signal may be approximately equal to a refresh frequency of the display apparatus, which may be such as 60 Hz or 120 Hz. The frequency of the second electrical signal may be approximately equal to a transmission frequency of the data transmitting terminal device, which may be such as 100 MHz. In this case, a transmission rate of the communication may be 100 Mbps. For example, the first threshold interval may be less than or equal to 300 Hz; the second threshold interval may be greater than 300 Hz, or greater than or equal to 1 MHz, or the like.

For another example, since the intensity of the external light is much greater than the intensity of the light reflected by the fingerprint, there is a difference between the electrical signal into which the external light is converted by the photosensitive sensing device 100 and the electrical signal into which the light reflected by the fingerprint is converted by the photosensitive sensing device 100. The magnitude (such as a voltage or a current) of the second electrical signal is greater than the magnitude of the first electrical signal. Therefore, types of the electrical signals may be determined by setting different threshold intervals for the magnitudes of the electrical signals. By setting the different threshold intervals to determine the types of the electrical signals, it is possible to make the operation of the display apparatus intelligent, and make the user operate the display apparatus easily.

For yet another example, an external switch is provided on the display apparatus, and the operating modes of the display apparatus are different when the switch is at different positions. For example, in a case where the switch is at a first position, the display apparatus operates in the fingerprint recognition mode; and in a case where the switch is at a second position, the display apparatus operates in the visible light communication mode. The first processing device may select a corresponding algorithm according to the operating mode of the display apparatus, so as to realize precise processing of the electrical signal. The operating modes of the display apparatus are switched by the switch. In a case where the display apparatus is in the fingerprint recognition mode, the algorithm used by the first processing device is the algorithm corresponding to the fingerprint recognition mode; and in a case where the display apparatus is in the visible light communication mode, the algorithm used by the first processing device is the algorithm corresponding to the visible light communication mode. Therefore, in a case where the operating mode of the display apparatus is not switched by the switch, the algorithm selected by the first processing device will not be switched during a certain time (a duration in which the position of the switch does not change). Therefore, no matter how great the magnitude and the frequency of the optical signal received by the display apparatus are, the electrical signal converted according to the optical signal may be processed according to the algorithm. The algorithm may not need to determine the type of the electrical signal being processed, algorithm settings may be relatively simple, and the display apparatus has a relatively strong capability of anti-interference of other optical signals. Moreover, by providing the external switch on the display apparatus, it is possible to easily switch the operating mode of the display apparatus, so that the user may easily determine which operating mode the display apparatus is in.

Figure 6A:
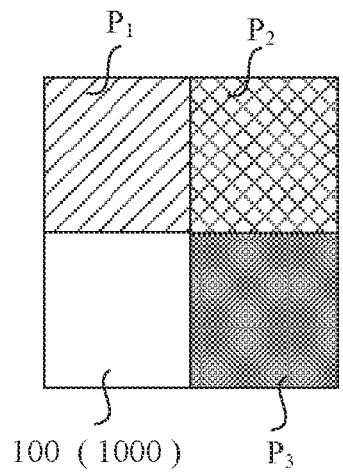
FIG. 6A is a structural diagram of a display recognition unit provided by embodiments of the present disclosure.

In some embodiments, as shown in FIG. 6A, in a display recognition unit 10, a photosensitive sensing device 100 includes one photosensitive sensor 1000. The photosensitive sensor 1000 is used to convert reflected light of light emitted from at least one sub-pixel into a first electrical signal, and is further used to convert an external light into a second electrical signal. That is, the photosensitive sensor 1000 is used in both the fingerprint recognition mode and the visible light communication mode when the display apparatus operates.

For example, the photosensitive sensor 1000 may refer to the structure shown in FIG. 5A or 5B. For example, the photosensitive sensor 1000 may be a PIN photodiode.

In some embodiments, in a case where the photosensitive sensing device 100 includes the one photosensitive sensor 1000, when the photosensitive sensor 1000 outputs an electrical signal to the first processing device, the first processing device needs to determine whether the received electrical signal is the first electrical signal or the second electrical signal.

In some other embodiments, in a case where the user has selected the operating mode of the display apparatus by the switch, when the photosensitive sensor outputs an electrical signal to the first processing device, the first processing device processes the electrical signal according to the operating mode of the display apparatus.

The photosensitive sensing device 100 includes the one photosensitive sensor 1000, so that the structure of the display recognition unit 10 is relatively simple, and it is convenient to manufacture the display recognition unit 10.

Figure 6B:
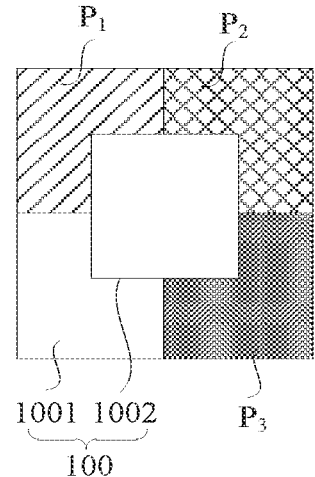
FIG. 6B is a structural diagram of another display recognition unit provided by embodiments of the present disclosure.

In some other embodiments, referring to FIG. 6B, a photosensitive sensing device 100 includes two photosensitive sensors, such as a first photosensitive sensor 1001 and a second photosensitive sensor 1002. The first photosensitive sensor 1001 is, for example, configured to convert reflected light of light emitted from at least one sub-pixel into a first electrical signal. The second photosensitive sensor 1002 is, for example, configured to convert an external light entering from the display side of the display apparatus into a second electrical signal.

For example, the first photosensitive sensor 1001 and the second photosensitive sensor 1002 each includes a PIN photodiode.

The first photosensitive sensor 1001 and the second photosensitive sensor 1002 are electrically connected to the first processing device. When the first processing device receives the first electrical signal output by the first photosensitive sensor, the first electrical signal is processed by using the algorithm based on the fingerprint recognition technology to obtain the texture image. When the first processing device receives the second electrical signal output by the second photosensitive sensor, the second electrical signal is processed by using the algorithm based on the visible light communication technology to determine the information contained in the external light. For example, the information contained in the external light is determined according to the magnitude and/or the frequency of the second electrical signal.

It will be noted that, in a case where a distance between the first photosensitive sensor 1001 and the second photosensitive sensor 1002 is relatively small, the reflected light of the light emitted from the at least one sub-pixel may be simultaneously transmitted to the first photosensitive sensor 1001 and the second photosensitive sensor 1002, and the external light may also be simultaneously transmitted to the first photosensitive sensor and the second photosensitive sensor. Since the first photosensitive sensor and the second photosensitive sensor do not distinguish the type of the received optical signal, when an optical signal is transmitted to the photosensitive sensing device, both the first photosensitive sensor and the second photosensitive sensor may operates, and convert the optical signal into electrical signals. However, only an electrical signal output by one photosensitive sensor is valid at a same time, and the first processing device only processes the valid electrical signal through an algorithmic.

Hereinafter, in order to simplify the description, the reflected light of the light emitted from the at least one sub-pixel is referred to as reflected light, and the external light entering from the display side of the display apparatus is referred to as external light.

For example, when both the first photosensitive sensor 1001 and the second photosensitive sensor 1002 receive the external light, although both the first photosensitive sensor and the second photosensitive sensor may convert the external light into electrical signals, the first processing device only processes the second electrical signal converted by the second photosensitive sensor.

For example, in a case where both the first photosensitive sensor 1001 and the second photosensitive sensor 1002 are electrically connected to the first processing device, and the signals are transmitted by different lines, the first processing device can determine whether the received electrical signal is the first electrical signal output by the first photosensitive sensor 1001 or the second electrical signal output by the second photosensitive sensor 1002. When the first processing device determines that the received electrical signal is the first electrical signal output by the first photosensitive sensor 1001, the algorithm based on the fingerprint recognition is selected to process the first electrical signal. When the first processing device determines that the received electrical signal is the second electrical signal output by the second photosensitive sensor 1002, the algorithm based on the visible light communication is selected to process the second electrical signal.

In some other embodiments, when the first photosensitive sensor 1001 also outputs a second electrical signal, the second electrical signal is not within the preset first threshold interval of the first electrical signal. In this way, the first processing device can determine that the second electrical signal output by the first photosensitive sensor 1001 is an invalid signal, and only process the second electrical signal output by the second photosensitive sensor 1002. When the second photosensitive sensor 1002 also outputs a first electrical signal, the first electrical signal is not within the preset second threshold interval of the second electrical signal. In this way, the first processing device may determine that the first electrical signal output by the second photosensitive sensor 1002 is an invalid signal, and only process the first electrical signal output by the first photosensitive sensor 1001.

In yet some other embodiments, in a case where the operating mode of the display apparatus is controlled by the external switch, an electrical connection between the first processing device and the second photosensitive sensor 1002 may be opened when the display apparatus operates in the fingerprint recognition mode, so that the second photosensitive sensor 1002 will not output an invalid first electrical signal to the first processing device, An electrical connection between the first processing device and the first photosensitive sensor 1001 may be opened when the display apparatus operates in the visible light communication mode, so that the first photosensitive sensor 1001 will not output an invalid second electrical signal to the first processing device.

In yet some other embodiments, in a case where the first processing device includes, for example, two microprocessors, one microprocessor is used to execute the algorithm based on the fingerprint recognition technology, and the other microprocessor is used to execute the algorithm based on the visible light communication. When the display apparatus is in the fingerprint recognition mode, the microprocessor for executing the algorithm based on the visible light communication may be controlled to not operate; and when the display apparatus is in the visible light communication mode, the microprocessor for executing the algorithm based on the fingerprint recognition technology may be controlled to not operate. Alternatively, the microprocessor for executing the algorithm based on the fingerprint recognition technology may determine whether the received electrical signal is the required first electrical signal according to the first threshold interval to which the preset first electrical signal is belonged. If the received electrical signal is not the first electrical signal, it will not be processed. The microprocessor for executing the algorithm based on the visible light communication may determine whether the received electrical signal is the required second electrical signal according to the second threshold interval to which the preset second electrical signal is belonged. If the received electrical signal is not the second electrical signal, it will not be processed.

The photosensitive sensing device 100 includes the first photosensitive sensor 1001 and the second photosensitive sensor 1002, the first photosensitive sensor 1001 is used to convert the reflected light, and the second photosensitive sensor 1002 is used to convert the external light. In a case where the operating mode of the display apparatus is controlled by the external switch, the first photosensitive sensor 1001 and the second photosensitive sensor 1002 operate alternately, so that service lives of the first photosensitive sensor 1001 and the second photosensitive sensor 1002 may be prolonged to a certain extent.

In some embodiments, the plurality of display recognition units are arranged at intervals in the display apparatus. That is, no sub-pixel is shared by one display recognition unit and another display recognition unit, and the one display recognition unit as a whole and the another display recognition unit are arranged at intervals. For example, referring to FIGS. 3 and 4A to 4C, a photosensitive sensing device 100 in a display recognition unit 10 is only shared by sub-pixels in this display recognition unit 10. For example, the photosensitive sensor in the display recognition unit 10 is only used to receive reflected light of light emitted from the sub-pixels in the display recognition unit 10. In some other embodiments, a display recognition unit includes a plurality of sub-pixels, and a part of the sub-pixels in the plurality of sub-pixels is shared by another display recognition unit. For example, referring to FIG. 7, a display recognition unit 10 includes one photosensitive sensing device 100 and four sub-pixels, and at least one sub-pixel in each display recognition unit 10 may be shared by an adjacent display recognition unit 10. For example, two adjacent display recognition units 10 in a row direction share one sub-pixel $P_3$ and one sub-pixel $P_2$. In this case, a photosensitive sensing device 100 in FIG. 7 may be configured to receive reflected light of light emitted from four adjacent sub-pixels. In a case where a part of subpixels in one display recognition unit is shared by another display recognition unit, reflected light of light emitted from a sub-pixel may be received by a plurality of photosensitive sensing devices 100, thereby improving the accuracy of the received optical signal.

In some embodiments, referring to FIGS. 4A to 4C, and 6A to 6B, a (e.g., each) display recognition unit 10 includes a plurality of sub-pixels. For example, the display recognition unit includes at least three colors of sub-pixels. For example, at least three colors of sub-pixels form a pixel, that is, each display recognition unit 10 is provided with one pixel. For example, referring to FIG. 7, the display panel 1 in the display apparatus includes the plurality of display recognition units 10 disposed on a substrate 11, and each display recognition unit 10 includes one pixel and one photosensitive sensing device 100. Each pixel includes at least three colors of sub-pixels, such as a sub-pixel $P_1$, a sub-pixel $P_2$ and a sub-pixel $P_3$.

Figure 7:
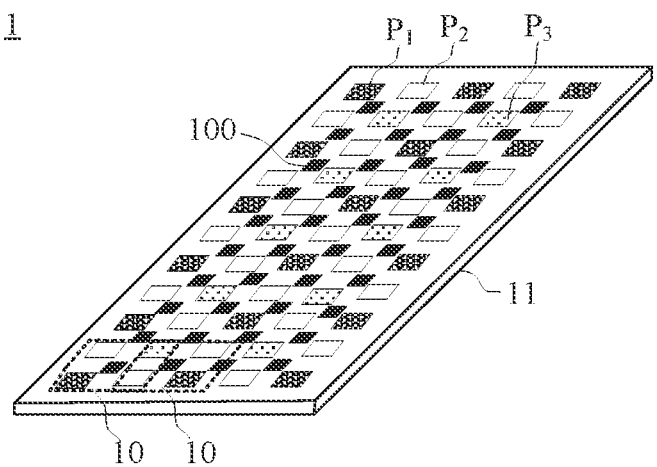
FIG. 7 is a structural diagram of a display panel in yet another display apparatus provided by embodiments of the present disclosure.

It will be noted that, in FIG. 7, some colors of sub-pixels are shared by two adjacent display recognition units 10.

In some embodiments, in conjunction with FIGS. 4A and 6A, a photosensitive sensing device 100 includes one photosensitive sensor 1000. That is, a (e.g., each) display recognition unit 10 is provided therein with one pixel and one photosensitive sensor 1000. For example, the sub-pixel $P_1$, the sub-pixel $P_2$, the sub-pixel $P_3$ and the photosensitive sensor 1000 in the pixel are arranged in a shape of a square with a cross therein (a shape like the Chinese character " 田 ").

In some other embodiments, in conjunction with FIGS. 4B and 6B, a (e.g., each) photosensitive sensing device 100 includes two photosensitive sensor 1000. That is, each display recognition unit 10 is provided therein with one pixel and two photosensitive sensors 1000. One of the photosensitive sensors 1000 is the first photosensitive sensor 1001, and the other photosensitive sensor 1000 is the second photosensitive sensor 1002. For example, a display recognition unit 10 is in a shape of a rectangle. The sub-pixel $P_1$, sub-pixel $P_2$, sub-pixel $P_3$ and the first photosensitive sensor 1001 in the pixel are respectively located at four corners of the rectangle, and the second photosensitive sensor 1002 is located at a center of the rectangle.

It will be noted that, the first photosensitive sensor 1001 and the second photosensitive sensor 1002 each may be disposed in a non-display region between adjacent sub-pixels, which will not affect aperture ratios the sub-pixels.

Figure 8:
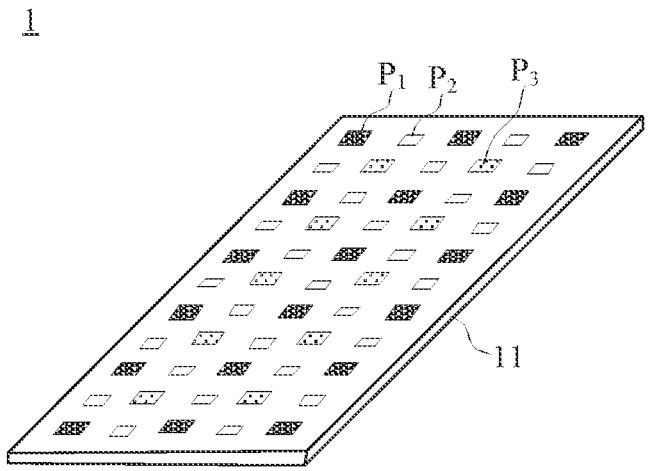
FIG. 8 is a structural diagram of a display panel in a display apparatus provided in the related art.

In another related art, referring to FIG. 8, a display panel 1 in a display apparatus includes a plurality of sub-pixels arranged in an array, and these sub-pixels also include sub-pixels $P_1$, sub-pixels $P_2$ and sub-pixels $P_3$. Regions between adjacent sub-pixels are non-display regions. In the display panel 1, these non-display regions are all vacant, and the display panel 1 only has a function of normal display. Therefore, a utilization rate of the substrate 11 in the display panel 1 is relatively low, and the function of the display panel 1 is single.

In the present disclosure, the photosensitive sensing device 100 is disposed in the non-display region between adjacent sub-pixels, which may improve the utilization rate of the substrate 11; moreover, one pixel is provided in a display recognition unit 10, so that a size of the display recognition unit 10 may reach a pixel level, which may improve a measurement accuracy of the display apparatus D.

Optionally, in a case where the photosensitive sensing device includes two photosensitive sensors, one of the two photosensitive sensors includes a plurality of photosensitive elements. The plurality of photosensitive elements are in one-to-one correspondence with at least two sub-pixels in the display recognition unit, or the plurality of photosensitive elements are in one-to-one correspondence with at least one sub-pixel in the display recognition unit and the other photosensitive sensor of the two photosensitive sensors.

The photosensitive element in the display recognition unit corresponds to the sub-pixel(s) in the display recognition unit means that the photosensitive element is arranged proximate to the sub-pixel(s).

Referring to FIGS. 9A to 9E, in a case where the photosensitive sensing device 100 includes the first photosensitive sensor 1001 and the second photosensitive sensor 1002, the second photosensitive sensor 1002 includes a plurality of photosensitive elements 1003. The plurality of photosensitive elements 1003 are in one-to-one correspondence with at least some (i.e., at least two) of the plurality of sub-pixels; alternatively, the plurality of photosensitive elements 1003 are in one-to-one correspondence with at least one sub-pixel and the first photosensitive sensor 1001.

For example, a photosensitive element 1003 includes, for example, a PIN photodiode. For another example, a size of the photosensitive element 1003 is less than a size of the first photosensitive sensor 1001.

Figure 9A:
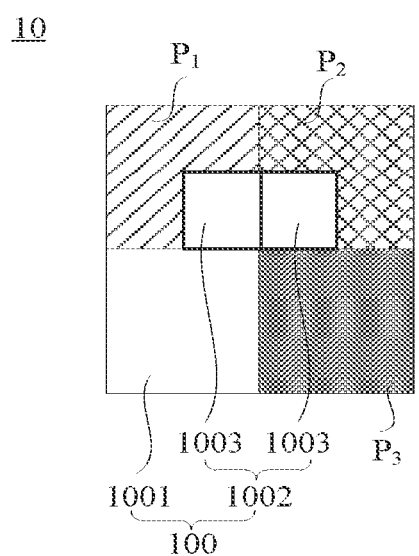
FIGS. 9A to 9E are structural diagrams of some display recognition units provided by embodiments of the present disclosure.

For example, referring to FIG. 9A, the second photosensitive sensor 1002 includes two photosensitive elements 1003, and the two photosensitive elements 1003 and two sub-pixels are in one-to-one correspondence.

Figure 9B:
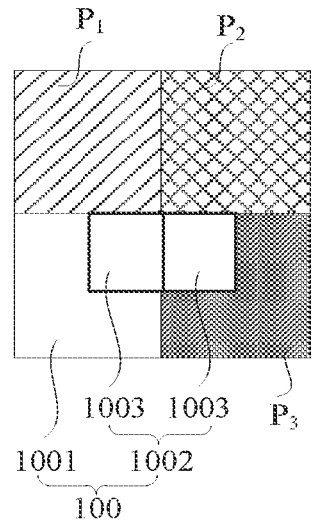

For another example, referring to FIG. 9B, the second photosensitive sensor 1002 includes two photosensitive elements 1003, one photosensitive element 1003 of the two photosensitive elements 1003 corresponds to one sub-pixel (e.g., the sub-pixel $P_3$), and the other photosensitive element 1003 of the two photosensitive elements 1003 corresponds to the first photosensitive element 1001.

Figure 9C:
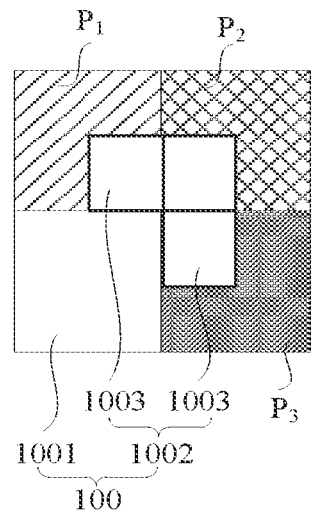

For yet another example, referring to FIG. 9C, the second photosensitive sensor 1002 includes three photosensitive elements 1003, and the three photosensitive elements 1003 and three sub-pixels (the sub-pixel $P_1$, the sub-pixel $P_2$, and the sub-pixel $P_3$) are in one-to-one correspondence.

Figure 9D:
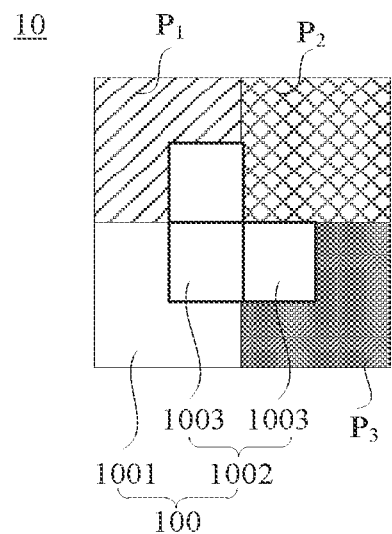

For yet another example, referring to FIG. 9D, the second photosensitive sensor 1002 includes three photosensitive elements 1003, one photosensitive element 1003 of the three photosensitive elements 1003 corresponds to the first photosensitive sensor 1001, and remaining two photosensitive elements 1003 and two sub-pixels (e.g., the sub-pixel $P_1$ and the sub-pixel $P_3$) are in one-to-one correspondence.

Figure 9E:
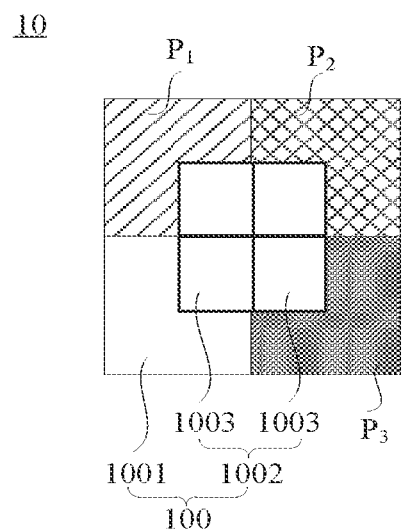

For yet another example, referring to FIG. 9E, the second photosensitive sensor 1002 includes four photosensitive elements 1003, one photosensitive element 1003 of the four photosensitive elements 1003 corresponds to the first photosensitive sensor 1001, and remaining three photosensitive elements 1003 are in one-to-one correspondence with the sub-pixel $P_1$, the sub-pixel $P_2$, and the sub-pixel $P_3$.

The second photosensitive sensor 1002 is divided into a plurality of photosensitive elements 1003, which may effectively utilize the non-display region between sub-pixels. In this way, an area of the second photosensitive sensor 1002 may be increased, and an area of a photoelectric conversion layer 105 may be increased. It is convenient for the photoelectric conversion layer 105 to receive the optical signal, thereby improving the measurement accuracy of the display apparatus.

Figure 10A:
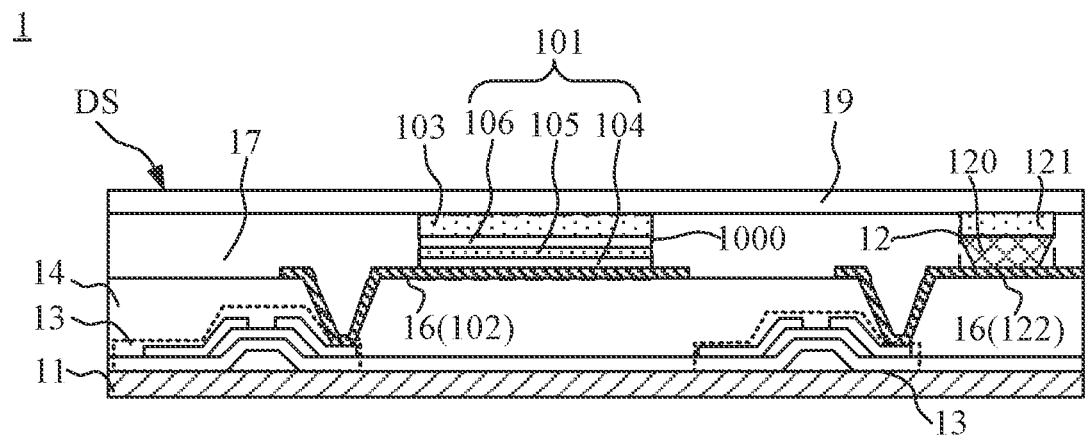
FIGS. 10A to 10E are sectional views of some display apparatuses provided by embodiments of the present disclosure.

Optionally, referring to FIG. 10A, the display panel 1 in the display apparatus further includes a substrate 11, a sub-pixel includes a light-emitting device 12, The light-emitting device 12 and the photosensitive sensing device 100 are disposed on a same side of the substrate. Each sub-pixel is provided therein with a light-emitting device 12. For example, in a case where the light-emitting device 12 is an organic light-emitting diode (OLED), the display apparatus including the light-emitting device 12 is an OLED display apparatus.

The light-emitting device 12 may include a third electrode 122, a fourth electrode 121 and a light-emitting functional layer 120 located therebetween. The third electrode 122 may be an anode, and the fourth electrode 121 may be a cathode; alternatively, the third electrode 122 may be a cathode, and the fourth electrode 121 may be an anode. The light-emitting functional layer 120 is a main structure for realizing the light-emitting function, and the light-emitting functional layer 120 includes a plurality of functional sub-layers, concretely. The functional sub-layer may be a thin film primarily formed by an organic material, and the thin film may be used to emit light or assist in emission. For example, the plurality of functional sub-layers may include a light-emitting layer, a hole injection layer, an electron injection layer, a hole transport layer, an electron transport layer, etc.

Figure 10B:
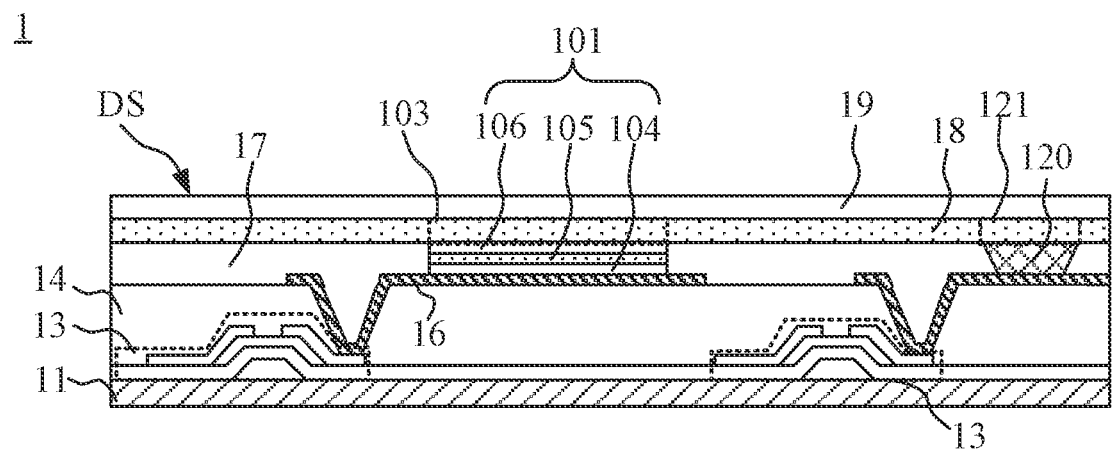

For example, referring to FIGS. 10A and 10B, the photosensitive sensing device 100 includes, for example, one photosensitive sensor 1000. The photosensitive sensor 1000 includes a first electrode 102, a second electrode 103 and a photosensitive sensing layer 101 located therebetween. Both the light-emitting device 12 and the photosensitive sensor 1000 are located on a side of the substrate 11 proximate to the display side DS. The light-emitting device 12 and the photosensitive sensing device 100 are disposed on a same side of the substrate 11, which may reduce a distance between the photosensitive sensing device 100 and an upper surface of the display apparatus (a surface on the display side DS, i.e., an upper surface of the display panel 1), thereby reducing attenuation of light in passing through the film layers in the display apparatus and improving the measurement accuracy of the display apparatus.

Optionally, referring to FIG. 10B, the second electrode 103 of the photosensitive sensor 1000 and the fourth electrode 121 of the light emitting device 12 may be connected, for example, form a whole-layer structure (a planar electrode layer 18). Therefore, the structure of the display recognition unit is simplified, and a thickness of the display apparatus D is reduced.

Optionally, referring to FIGS. 10A and 10B, the light-emitting functional layer 120 and the photosensitive sensing layer 101 are located on a same layer. Further, the light-emitting device 12 and the photosensitive sensing device 100 (which may include one photosensitive sensor 1000) may be located on a same layer. In this case, the third electrode 122 in the light-emitting device 12 and the first electrode 102 in the photosensitive sensing device 100 may be disposed on a same layer, that is, they are all located on a same insulating layer (the insulating layer 14).

The same layer means that the light-emitting functional layer 120 and the photosensitive sensing layer 101 are disposed on a same film layer.

For example, referring to FIGS. 10A and 10B, the third electrode 122 of the light-emitting device 12 and the first electrode 102 of the photosensitive sensor 1000 may belong to a same pattern layer, that is, they may be different patterns of a same film formed by a patterning process. In a case where both the third electrode 122 and the first electrode 102 are anodes, the pattern layer may be referred to as an anode pattern layer 16, and the third electrode 122 and the first electrode 102 may be referred to as anode patterns. The light-emitting functional layer 120 in the light-emitting device is electrically connected to a thin film transistor 13 through the third electrode 122, and the photosensitive sensing layer 101 in the photosensitive sensing device 100 is electrically connected to another thin film transistor 13 through the first electrode 102, Both the light-emitting functional layer 12 and the photosensitive sensing layer 101 are located on a side of the anode pattern layer 16 away from the substrate 11. Thicknesses of the light-emitting functional layer 120 and the photosensitive sensing layer 101 may be the same or different; and correspondingly, thicknesses of the light-emitting device 12 and the photosensitive sensor 1000 may be the same or different.

In a case where the light-emitting device 12 and the photosensitive sensing device 100 are located on the same layer, it is convenient to realize the electrical connection between the photosensitive sensing device 100 and the thin film transistor 13. The thin film transistors are further used to electrically connected to various lines such as gate lines, data lines, and output signal lines, so that the various lines may accurately control operation of the light-emitting device and the photosensitive sensing device 100 through the thin film transistors. Moreover, the electrical signals in the photosensitive sensing device 100 may be detected more accurately through the thin film transistor electrically connected to the photosensitive sensing device 100. For example, the electrical signals in the photosensitive sensing device 100 may be read through the thin film transistor in a time-division manner.

Figure 10C:
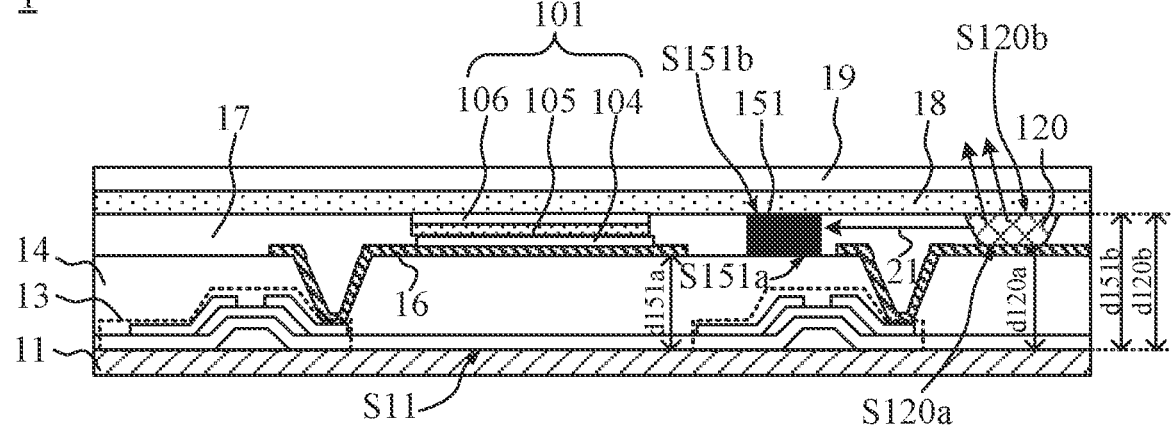
Figure 10D:
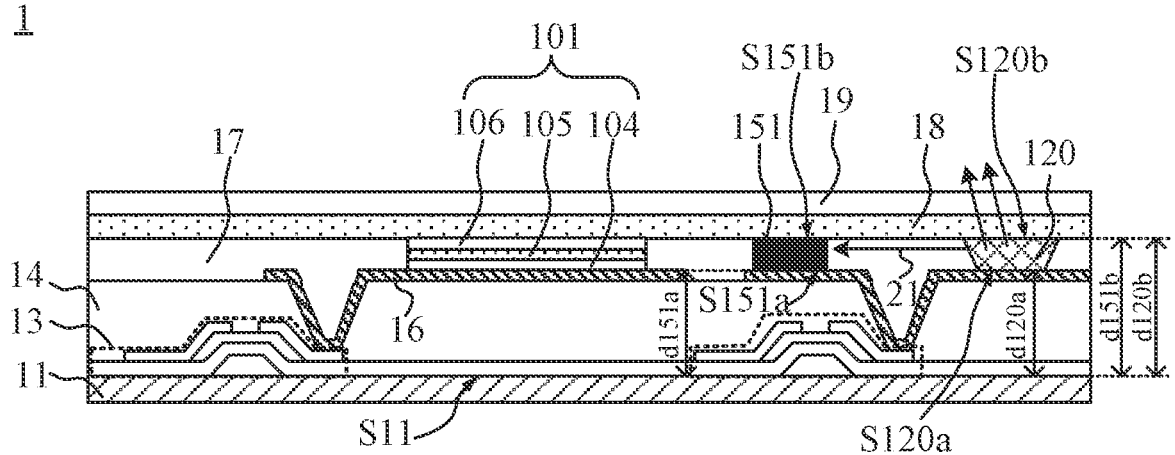

Optionally, the display apparatus D further includes first light-shielding patterns 151. Referring to FIGS. 10C and 10D, the first light-shielding pattern 151 and the photosensitive sensing device 100 are located on a same side of the substrate 11, and the first light-shielding pattern 151 is located between the light-emitting device 12 and the photosensitive sensing device 100. That is, an orthographic projection of the first light-shielding pattern 151 on the substrate 11 is located between an orthographic projection of the light-emitting device 12 on the substrate 11 and an orthographic projection of the photosensitive sensing device 100 on the substrate 11.

The orthographic projection of the light-emitting device 12 on the substrate 11 refers to an orthographic projection of a portion of the light-emitting device 12 within a border thereof on the substrate 11, and may refer to an orthographic projection of a light-emitting region of the light-emitting device 12 on the substrate 11. Since the cathode or the anode of the light-emitting device 12 may be a portion of a whole-layer structure or a structure shared with other components, the border of the light-emitting device 12 is defined as a border of the light-emitting functional layer 120 thereof. The orthographic projection of the light-emitting device 12 on the substrate 11 may be, for example, an orthographic projection of the light-emitting functional layer 120 thereof on the substrate 11. Similarly, a border of the photosensitive sensing device 100 is defined as a border of the photosensitive sensing layer 101 thereof, and the orthographic projection of the photosensitive sensing device 100 on the substrate 11 is an orthographic projection of the photosensitive sensing layer 101 thereof on the substrate 11.

Referring to FIGS. 10O and 10D, a distance d151a between a surface S151a of the first light-shielding pattern 151 proximate to the substrate 11 and a surface S11 of the substrate 11 on which the above structures are provided is less than or equal to a distance d120a between a surface S120a of the light-emitting functional layer 120 of the light-emitting device proximate to the substrate 11 and the surface S11 of the substrate 11. That is, the surface S151a of the first light-shielding pattern 151 proximate to the substrate 11 is lower than or flush with the surface S120a of the light-emitting functional layer 120 proximate to the substrate 11. Referring to FIGS. 10C and 10D, a distance d151b between a surface S151b of the first light-shielding pattern 151 away from the substrate 11 and the surface 311 of the substrate 11 is greater than or equal to a distance d120b between a surface S120b of the light-emitting functional layer 120 of the light emitting device away from the substrate 11 and the surface 311 of the substrate 11. That is, the surface S151b of the first light-shielding pattern 151 away from the substrate 11 is higher than or flush with the surface S120b of the light-emitting functional layer 120 away from the substrate 11.

Referring to FIG. 10O, the surface S151a of the first light-shielding pattern 151 proximate to the substrate 11 is lower than the surface S120a of the light-emitting functional layer 120 proximate to the substrate 11. That is, the distance d151a between the surface 3151a of the first light-shielding pattern 151 proximate to the substrate 11 and the surface S11 of the substrate 11 is less than the distance d120a between the surface 3120a of the light-emitting functional layer 120 proximate to the substrate 11 and the surface 311 of the substrate 11. The surface S151b of the first light-shielding pattern 151 away from the substrate 11 is flush with the surface S120b of the light-emitting functional layer 120 away from the substrate 11. That is, the distance d151b between the surface S151b of the first light-shielding pattern 151 away from the substrate 11 and the surface S11 of the substrate 11 is equal to or approximately equal to the distance d120b between the surface S120b of the light-emitting functional layer 120 away from the substrate 11 and the surface 311 of the substrate 11.

For example, referring to FIG. 100, the first light-shielding pattern 151 is disposed on the insulating layer 14, the light-emitting functional layer 120 is disposed on the anode pattern layer 16, and the anode pattern layer 16 is disposed on the insulating layer 14. Therefore, a thickness of the first light-shielding pattern 151 is greater than the thickness of the light-emitting functional layer 120. A material of the insulating layer 14 is, for example, at least one of silicon oxide and silicon nitride.

Referring to FIG. 10D, the surface S151a of the first light-shielding pattern 151 proximate to the substrate 11 is flush with the surface S120a of the light-emitting functional layer 120 proximate to the substrate 11. That is, the distance d151a between the surface S151a of the first light-shielding pattern 151 proximate to the substrate 11 and the surface S11 of the substrate 11 is equal to or approximately equal to the distance d120a between the surface S120a of the light-emitting functional layer 120 proximate to the substrate 11 and the surface S11 of the substrate 11. The surface S151b of the first light-shielding pattern 151 away from the substrate 11 is flush with the surface S120b of the light-emitting functional layer 120 away from the substrate 11. That is, the distance d151b between the surface S151b of the first light-shielding pattern 151 away from the substrate 11 and the surface S11 of the substrate 11 is equal to or approximately equal to the distance d120b between the surface S120b of the light-emitting functional layer 120 away from the substrate 11 and the surface S11 of the substrate 11.

For example, referring to FIG. 10D, both the first light-shielding pattern 151 and the light-emitting functional layer 120 are disposed on the anode pattern layer 16, and the thicknesses thereof are equal or approximately equal.

A material of the first light-shielding pattern 151 is, for example, the same as a material of a black matrix, such as perovskite, or resin material.

Referring to FIGS. 10C and 10D, light emitted by the light-emitting functional layer 120 of the light-emitting device scatters in various directions. Therefore, part of the light may be directly received by the photosensitive sensing device, or part of the light may be reflected by a film layer (the film layer located above the light-emitting functional layer 120, such as a cathode layer) and then received by the photosensitive sensing device. When the display apparatus D is in the fingerprint recognition mode, the first light-shielding pattern 151 is used to prevent the light emitted from the light-emitting functional layer 120 that is not reflected by the fingerprint from being received by the photosensitive sensing device, thereby avoiding an effect on the recognition of the reflected light. When the display apparatus D is in the visible light communication mode, the first light-shielding pattern 151 is used to prevent the light emitted from the light-emitting functional layer 120 from interfering with the external light.

Referring to FIGS. 10B to 10D, in the display apparatus, a pixel defining layer 17 is provided on the side of the anode pattern layer away from the substrate 11. The pixel defining layer 17 includes a plurality of hollowed-out regions, and each hollowed-out region is provided with a light-emitting functional layer 120 therein. A cathode layer 18 is provided on the surfaces of the light-emitting functional layer 120 and the photosensitive sensing layer 101 away from the substrate 11, and the cathode layer 18 is used to provide a cathode voltage for the light-emitting functional layer 120. A cover plate 19 is provided on the cathode layer 18, and the cover plate 19 is used to protect film layers located thereunder.

Figure 10E:
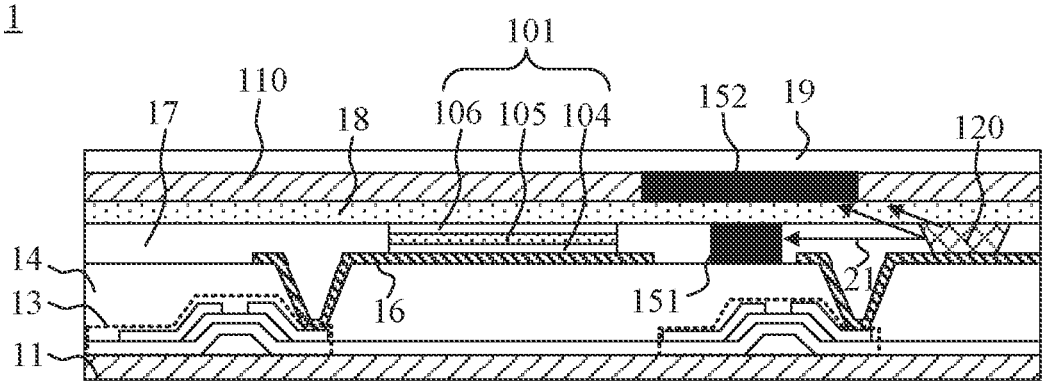

Optionally, the display apparatus further includes second light-shielding patterns 152. Referring to FIG. 10E the second light-shielding pattern 152 is disposed on a side of the first light-shielding pattern 151 away from the substrate 11, and an orthographic projection of the second light-shielding pattern 152 on the substrate 11 is located between the orthographic projection of the photosensitive sensing device 100 on the substrate 11 and the orthographic projection of the light-emitting device 12 on the substrate 11.

For example, referring to FIG. 10E, the second light-shielding pattern 152 is disposed between the cathode layer 18 and the cover plate 19. The second light-shielding pattern 152 may be formed on the cathode layer 18, or may be formed on a side of the cover plate 19 proximate to the substrate 11. A planarization layer 110 is provided on a same layer as the second light-shielding pattern, and the planarization layer has a planarization effect.

A material of the second light-shielding pattern 152 is, for example, the same as the material of the black matrix, such as perovskite, or resin material. The material of the second light-shielding pattern 152 and the material of the first light-shielding pattern 151 may be the same or different, which is not limited in the present disclosure.

The second light-shielding pattern 152 is used to further prevent the light emitted from the light-emitting device 12 from interfering with the reflected light and the external light.

Figure 10F:
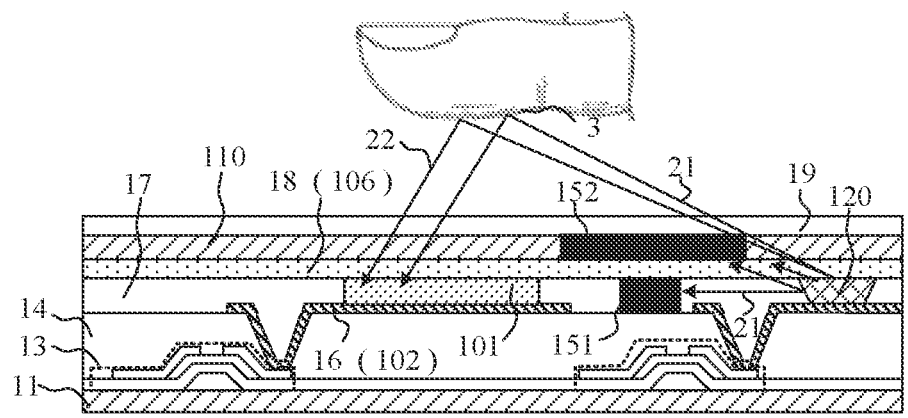
FIG. 10F is an optical path diagram of a display apparatus in a fingerprint recognition mode provided by embodiments of the present disclosure.
Figure 10G:
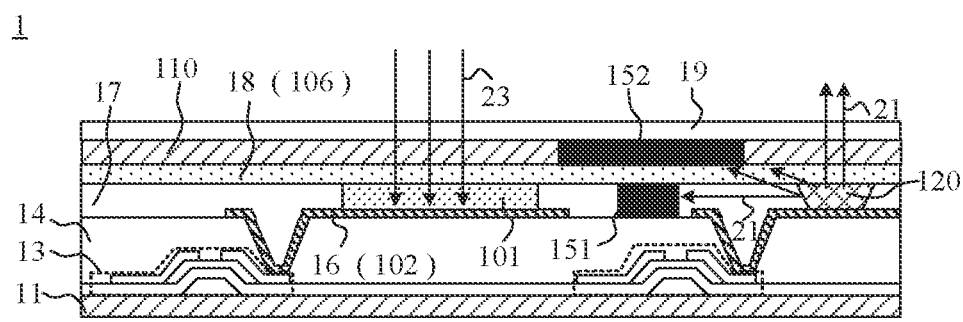
FIG. 10G is an optical path diagram of a display apparatus in a visible light communication mode provided by embodiments of the present disclosure.
Figure 10H:
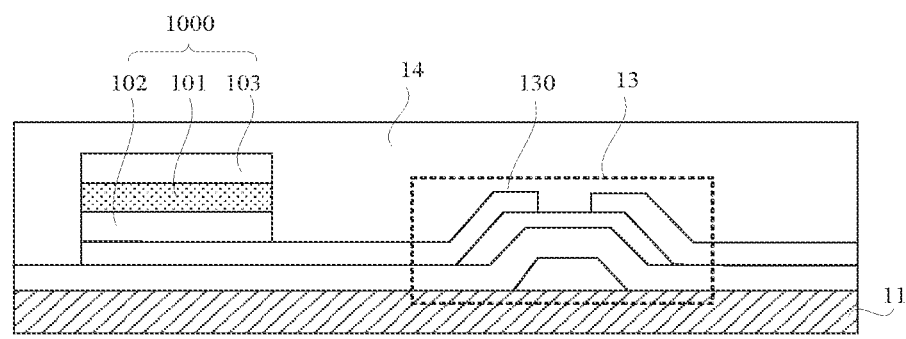
FIG. 10H is a sectional view of a display panel in yet another display apparatus provided by embodiments of the present disclosure.

Optionally, referring to FIG. 10H, the photosensitive sensor 1000 in the photosensitive sensing device 100 may be directly electrically connected to a drain 130 of the thin film transistor 13, so that a manufacturing process and a structure thereof are relatively simple. The orthographic projection of the photosensitive sensor 1000 on the substrate 11 may be within an orthographic projection of the drain 130 of the thin film transistor 13 on the substrate 11, so that the drain 130 of the thin film transistor 13 may have a light-shielding effect, which may prevent light entering from a side of the drain 130 away from the photosensitive sensor 1000 from interfering with the photosensitive sensor 1000.

Paths of the light received by the photosensitive sensor 1000 are described below when the display device is in different operating modes.

Referring to FIG. 10F, when the display apparatus is in the fingerprint recognition mode, light 21 emitted from the sub-pixel is reflected by a fingerprint 3, and then is received by the photosensitive sensing layer 101 (e.g., the photoelectric conversion layer 105) in the photosensitive sensor. The optical signal will be converted into the first electrical signal. Due to existence of the first light-shielding pattern 151 and the second light-shielding pattern 152, part of the light 21 emitted from the sub-pixel that is not reflected by the fingerprint 3 will not be received by the photosensitive sensing layer 101 (e.g., the photoelectric conversion layer 105).

Referring to FIG. 10G, when the display apparatus is in the visible light communication mode, part of the light 21 emitted from the sub-pixel is shielded by the first light-shielding pattern 151 and the second light-shielding pattern 152, and will not be received by the photosensitive sensing layer 101 (e.g., the photoelectric conversion layer), and part of the light that directly exits from the cover plate 19 will also not be received by the photosensitive sensing layer 101 (e.g., the photoelectric conversion layer). Only the external light 23 provided by the user may be received by the photosensitive sensing layer 101 (e.g., the photoelectric conversion layer), and then be converted into the second electrical signal. The user provides the external light 23 through, for example, a flashlight of a mobile phone. In some embodiments, the user's mobile phone is provided with a software that may adjust a magnitude and a frequency of the external light 23 provided by the flashlight of the mobile phone. For example, the user may set different unlocking passwords by adjusting the frequency of the flashlight through the software. The frequency of the flashlight refers to a frequency at which the flashlight is turned on and off. For example, the flashlight being turned on represents a digital signal 1, and the flashlight being turned off represents a digital signal 0. Then, the flashlight is continuously turned on and off (flickering) at a certain frequency, which may correspond to a binary string.

It will be noted that the above apparatus that may provide the external light 23 is not limited to the flashlight of the mobile phone, and may also be an LED light, or even a display screen (display panel) of the mobile phone. In a case where the display screen of the mobile phone is used to provide the external light 23, the present disclosure may further realize data transmission between the mobile phone and the display apparatus without additional other network.

Optionally, the display apparatus D further includes a backlight module, and the display apparatus D is, for example, a liquid crystal display apparatus D.

For example, a liquid crystal display panel may be of, for example, any one of a twisted nematic (TN) mode, an in-plane switching (IPS) mode, a fringe field switching (FFS) mode and other modes. The TN liquid crystal display panel may be in a normally white mode when supplied with no voltage, and the IPS liquid crystal display panel and the FFS liquid crystal display panel are in the normally white mode when supplied with a voltage.

Figure 11A:
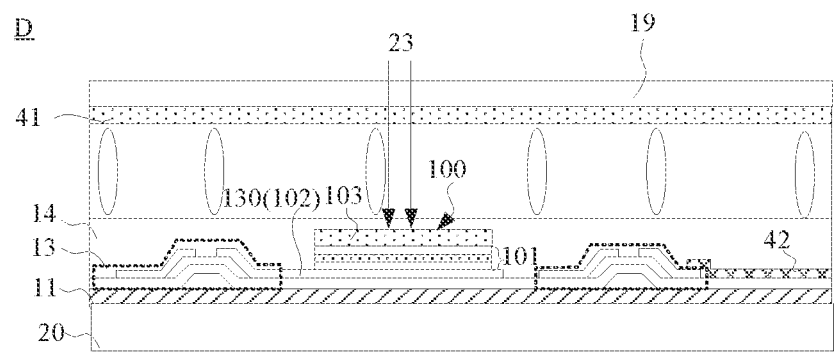

FIG. 11A shows a TN liquid crystal display apparatus. Referring to FIG. 11A, in the display apparatus D, a pixel electrode 42 and a common electrode 41 are respectively located on two opposite sides of a liquid crystal layer. The first electrode 102 of the photosensitive sensing device 100 is also used as the drain 130 of the thin film transistor 13.

Figure 11B:
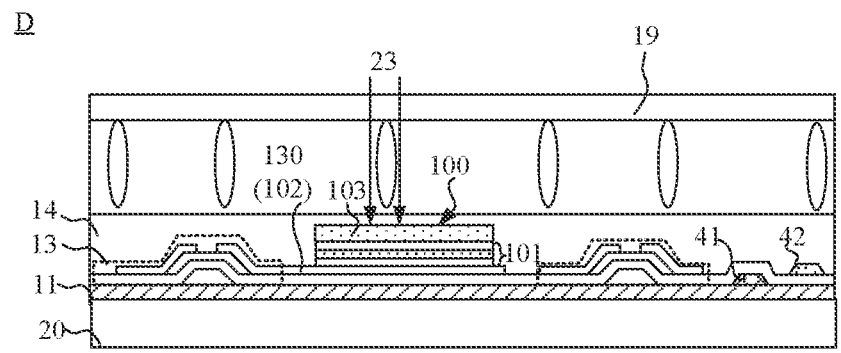

FIG. 11B shows an IPS liquid crystal display apparatus. In the display apparatus D, a pixel electrode 42 and a common electrode 41 are located on a same side of a liquid crystal layer.

Referring to FIGS. 11A to 11D, the display apparatus D (in this case, which is the liquid crystal display apparatus) further includes a backlight module 20 configured to provide a light source for sub-pixels of the liquid crystal display panel in the liquid crystal display apparatus, so that the sub-pixels emit light. In this way, the photosensitive sensing device 100 may receive the reflected light of the light 21 emitted from at least one sub-pixel. That is, when the display apparatus D is in the fingerprint recognition mode, the backlight module operates normally to provide the light source for the sub-pixels. After reflected by the fingerprint, the light 21 emitted from the sub-pixels may be received by the photosensitive sensing device 100.

Referring to FIGS. 11A and 11B, the backlight module 20 is configured to stop providing the light source for the sub-pixels when the photosensitive sensing device 100 receives the external light 23 that enters from the display side of the display apparatus D. That is, when the display apparatus D is in the visible light communication mode, the backlight module is turned off. In this case, no light exits from the backlight module. The backlight module stops providing the light source for the sub-pixels, and the external light 23 may pass through the liquid crystal layer of the liquid crystal display panel and may be received by the photosensitive sensing device 100. When the backlight module is turned off, the liquid crystal display panel need to be in the normally white mode to ensure that the photosensitive sensing device 100 receives the external light.

In a case where the display apparatus D is the liquid crystal display apparatus, by controlling the operating state of the backlight module, it is possible to control the entering of the reflected light, and to completely avoid a situation that the sub-pixels emit light when the display apparatus D receives the external light 23. As a result, an effect of the light emitted from the sub-pixels on the external light may be completely eliminated. The user may determine whether the operating mode of the display apparatus D is the fingerprint recognition mode or the visible light communication mode through the operating state of the backlight module. The power consumption of the display apparatus D may be reduced by turning off the backlight module in the visible light communication mode.

Optionally, the display apparatus D further includes third light-shielding patterns 153. Referring to FIGS. 11C and 11D, the third light-shielding pattern 153 is disposed between the substrate 11 and the photosensitive sensing device 100, and the orthographic projection of the photosensitive sensing device 100 on the substrate 11 is within an orthographic projection of the third light-shielding pattern 153 on the substrate 11.

For example, the third light-shielding pattern 153 is formed before the thin film transistor 13 is formed. The third light-shielding pattern 153 may prevent light emitted from a light source located under the photosensitive sensing device 100 from irradiating the photosensitive sensing device 100. For example, when the display apparatus is in the fingerprint recognition mode, since the backlight module 20 is turned on, the photosensitive sensing device 100 may receive not only the light that is emitted from the sub-pixels and reflected by the fingerprint, but also light that is emitted from the backlight module 20 located thereunder and directly directed thereto. Generally, an intensity of the light that is emitted from the backlight module 20 and directly directed thereto is much greater than the intensity of the light that is emitted from the sub-pixels and reflected by the fingerprint. Therefore, an effective signal (the first electrical signal) included in the electrical signal that is converted by the photosensitive sensing device 100 according to the received optical signal is with a very low percentage, that is, a noise of the effective signal is very large. Therefore, the texture image generated by the first processing device may be inaccurate.

Optionally, the display apparatus Q (a display panel) further includes a plurality of gate lines, a plurality of data lines and at least one output signal line. The plurality of gate lines are used to transmit gate driving signals to the thin film transistors 13; the plurality of data lines are used to transmit data signals to the thin film transistors 13; and the at least one output signal line is used to transmit the first electrical signal and the second electrical signal output by the photosensitive sensing device 100 to the first processing device.

For example, the display panel includes a plurality of first gate lines, a plurality of second gate lines, a plurality of third gate lines, at least one first output signal line and at least one second output signal line. In a case where the photosensitive sensing device includes one photosensitive sensor, the photosensitive sensor is connected to a first gate line and a first output signal line, and a sub-pixel is connected to a second gate line. In a case where the photosensitive sensing device includes two photosensitive sensors, one photosensitive sensor of the two photosensitive sensors is connected to a first gate line and a first output signal line, the other photosensitive sensor of the two photosensitive sensors is connected to a third gate line and a second output signal line, and a sub-pixel is connected to a second gate line.

The photosensitive sensing device and the sub-pixel are respectively connected to different gate lines, which may realize separate control of the photosensitive sensing device, and then control the display apparatus to activate the light communication function or the fingerprint recognition function in a fixed mode. Further, in the case where the photosensitive sensing device includes the two photosensitive sensors, each photosensitive sensor may be also controlled by different gate lines, so that the light communication function and the fingerprint recognition function may also be controlled separately.

Figure 12A:
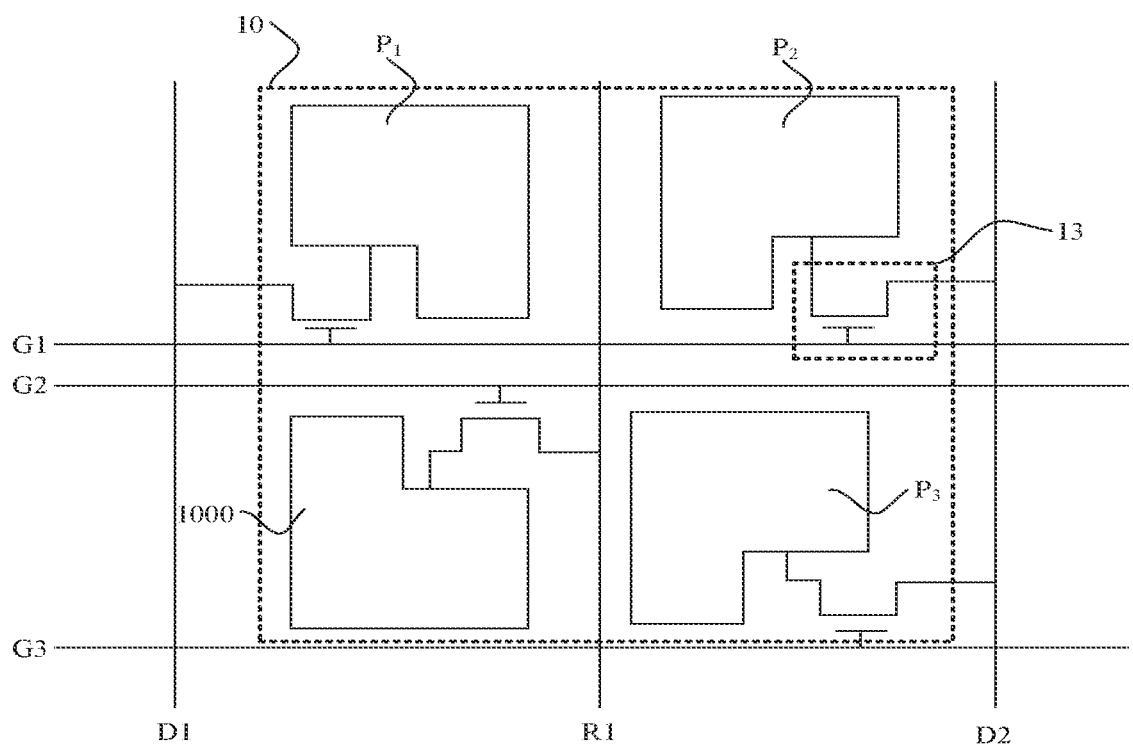
FIG. 12A is a structural diagram of yet another display recognition unit provided by embodiments of the present disclosure.

For example, referring to FIG. 12A, in a case where the photosensitive sensing device 100 includes one photosensitive sensor 1000, there exits the following setting manner.

Pixels in a same row are connected to three gate lines. The photosensitive sensor 1000 is connected to one gate line (a first gate line), and at least three colors of sub-pixels are connected to two gate lines (second gate lines).

Pixels in a same column are connected to two data lines and one output signal line (a first output signal line). The photosensitive sensor 1000 is connected to the output signal line, and at least three colors of sub-pixels are connected to the two data lines.

For example, referring to FIG. 12A, each display recognition unit 10 includes one pixel and one photosensitive sensor 1000, and each pixel includes a sub-pixel $P_1$, a sub-pixel $P_2$ and a sub-pixel $P_3$.

The sub-pixel $P_1$ is electrically connected to a gate line G1 and a data line D1; the sub-pixel $P_2$ is electrically connected to the gate line G1 and a data line D2; the photosensitive sensor 1000 is electrically connected to a gate line G2 and an output signal line R1; and the sub-pixel $P_3$ is electrically connected to a gate line G3 and the data line D2. The gate line G2 is a first gate line, the gate line G1 and the gate line G3 are second gate lines, and the output signal line R1 is a first output signal line.

The sub-pixel $P_1$, the sub-pixel $P_2$, the sub-pixel $P_3$ and the photosensitive sensor 1000 may be electrically connected to the corresponding gate lines, data lines and output signal line through, for example, the thin film transistors 13.

Alternatively, in a case where the photosensitive sensing device 100 includes the first photosensitive sensor 1001 and the second photosensitive sensor 1002, there exits the following setting manner.

Pixels in a same row are connected to four gate lines. The first photosensitive sensor 1001 and the second photosensitive sensor 1002 are connected to two gate lines in one-to-one correspondence, and at least three colors of sub-pixels are connected to another two gate lines.

Pixels in a same column are connected to two data lines and two output signal lines. The first photosensitive sensor 1001 and the second photosensitive sensor 1002 are connected to the two output signal lines in one-to-one correspondence, and at least three colors of sub-pixels are electrically connected to the two data lines.

Figure 12B:
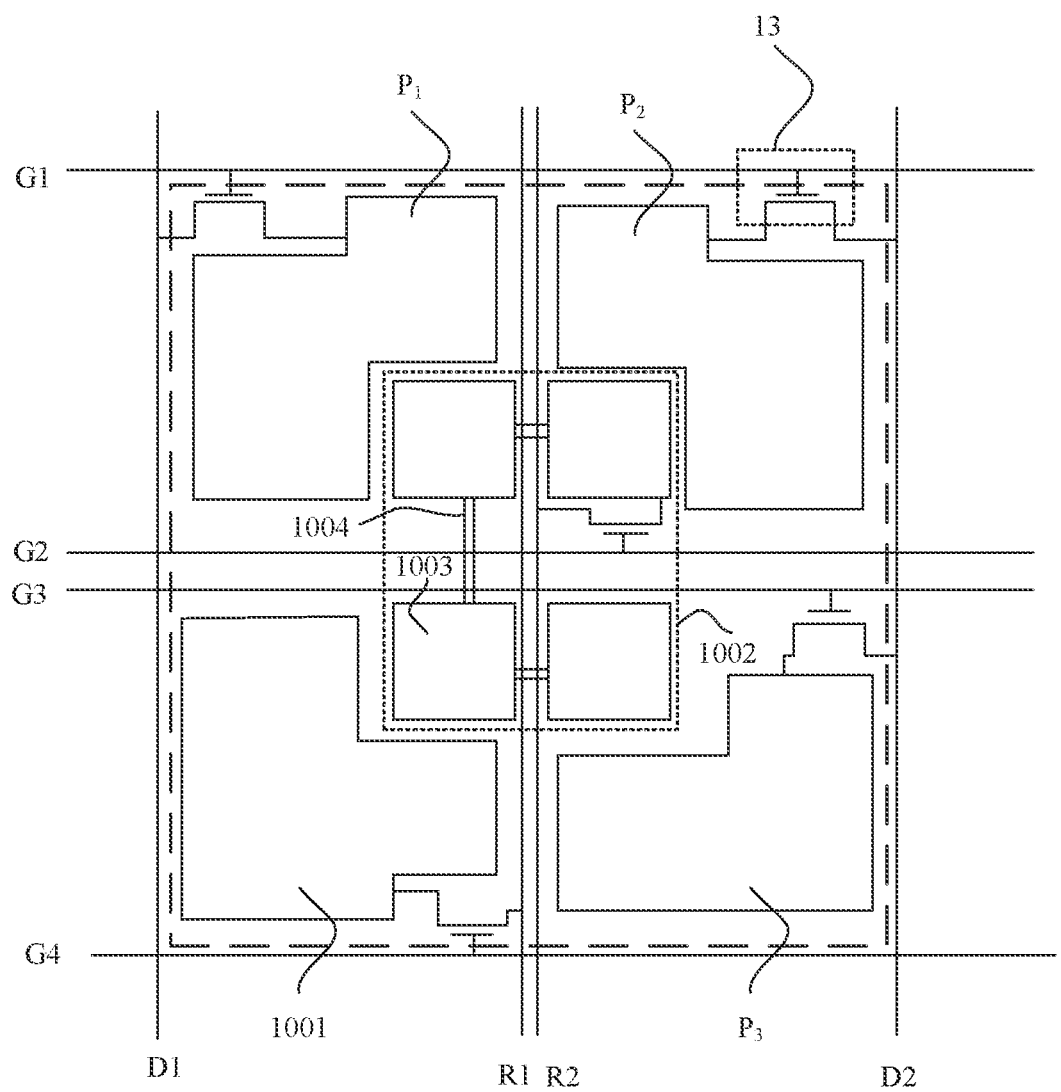
FIG. 12B is a structural diagram of yet another display recognition unit provided by embodiments of the present disclosure.

For example, referring to FIG. 12B, each display recognition unit 10 includes one pixel, a first photosensitive sensor 1001 and a second photosensitive sensor 1002. Each pixel includes a sub-pixel $P_1$, a sub-pixel $P_2$ and a sub-pixel $P_3$, and the second photosensitive sensor 1002 includes four photosensitive elements 1003. The four photosensitive elements 1003 are in one-to-one correspondence with the three sub-pixels (the sub-pixel $P_1$, the sub-pixel $P_2$, and the sub-pixel $P_3$) and the first photosensitive sensor 1001. The four photosensitive elements 1003 are connected in series by connection lines 1004.

Referring to FIG. 12B, the sub-pixel $P_1$ is electrically connected to a gate line G1 and a data line D1; the sub-pixel $P_2$ is electrically connected to the gate line G1 and a data line D2; the sub-pixel $P_3$ is electrically connected to a gate line G3 and the data line D2; the first photosensitive sensor 1001 is electrically connected to a gate line G4 and an output signal line R1; the second photosensitive sensor 1002 is electrically connected to the gate line G2 and an output signal line R2. The gate line G1 and the gate line G3 are second gate lines, the gate line G4 is a first gate line, the gate line G2 is a third gate line, the output signal line R1 is a first output signal line, and the output signal line R2 is a second output signal line.

The sub-pixel $P_1$, the sub-pixel $P_2$, the sub-pixel $P_3$, the photosensitive sensor 1001 and the second photosensitive sensor 1002 may be electrically connected to the corresponding gate lines, data lines and output signal lines through the thin film transistors 13.

In some other embodiments, the first photosensitive sensor 1001 and the second photosensitive sensor 1002 may be directly electrically connected to the corresponding gate lines and output signal lines. The direct electrical connection may be understood as electrical connection through wire(s).

The second photosensitive sensor 1002 includes the four photosensitive elements 1003, and adjacent photosensitive elements 1003 are electrically connected by the connection line 1004. An area of the connection line 1004 is small. Compared to a case where the entire photosensitive element 1003 crosses the gate lines and the signal output lines, the connection line 1004 crossing the data lines (e.g., the gate line G2 and the gate line G3) and the signal output lines (e.g., the signal output line R1 and the signal output line R2) may reduce parasitic capacitances between the second photosensitive sensor 1002 and both the gate lines and the signal output lines.

Referring to FIG. 12B, it will be understood by those skilled in the art that, positions of the gate lines, the data lines and the output signal lines in the figure may be changed. For example, the gate line G1 may also be located between the sub-pixel P1 and the first photosensitive sensor 1001, positions of the data line D1 and the data line D2 may be interchanged with positions of the output signal line R1 and the output signal line R2. Therefore, in the present disclosure, the positions of the gate lines, the data lines, and the output signal lines are not limited by FIGS. 12A and 12B.

It will be understood by those skilled in the art that, the numbers of the gate lines and the data lines in FIGS. 12A and 12B correspond to an arrangement of the at least three colors of sub-pixels, which is merely as an example to describe a wiring manner of the display apparatus D in some embodiments of the present disclosure, and does not limit the numbers and the positions of the gate lines and the data lines accordingly. For example, referring to FIG. 3, the at least three colors of sub-pixels may also be connected to a same gate line. Of the at least three colors of sub-pixels, each sub-pixel is electrically connected to a data line.

Referring to FIG. 10B, it will be understood by those skilled in the art that, the gate lines and a gate layer in the thin film transistors 13 are disposed in a same layer and made of a same material, and the data lines and sources and drains of the thin film transistors 13 are disposed in a same layer and made of a same material. Since the photosensitive sensing device 100 is disposed on a side of the sources and the drains away from the substrate 11, the connection lines 1004 overlap with the gate lines and the data lines. However, since the area of the connection line 1004 is small, no large parasitic capacitance will be generated.

Optionally, the visible light communication device provided by the embodiments of the present disclosure may also be used as a data receiving and transmitting device in the visible light communication system. The optical element in the visible light communication device may be, for example, an element that may provide an optical signal, such as a display panel or an illuminant. The optical element provide a data-transmitting condition for the visible light communication, and communication between a device and another device may be realized by transmitting an optical signal containing information to be transmitted through the optical element. For example, the display panel or the illuminant is controlled to transmit an optical signal with intensity and/or frequency changed according to a certain rule, where the intensity and/or the frequency of the optical signal correspond to specific information.

Figure 13:
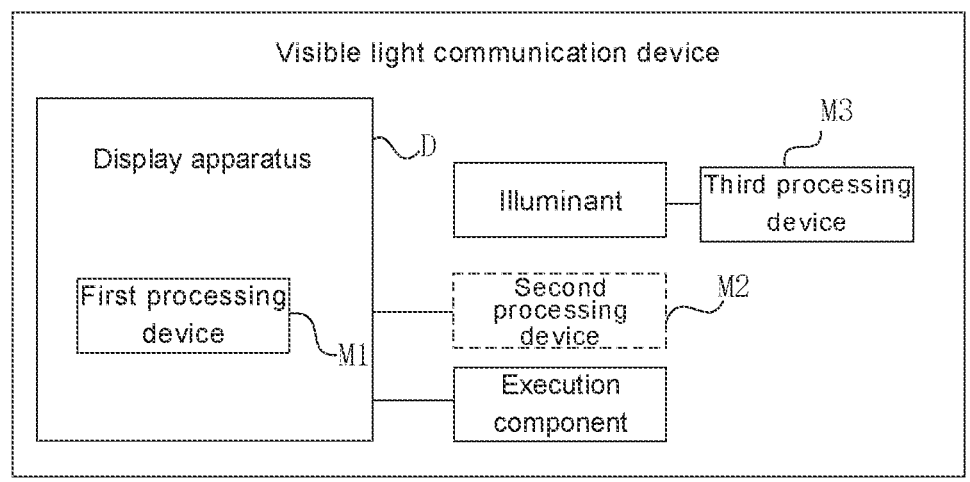
FIG. 13 is a structural diagram of another visible light communication device provided by embodiments of the present disclosure.

In some embodiments, referring to FIG. 13, the visible light communication device may further include a second processing device M2, the second processing device M2 is configured to control at least one display recognition unit in the display apparatus D to transmit the optical signal containing the information. For example, the second processing device M2 may be coupled to the display apparatus D. The second processing device M2 may be coupled to the display panel in the display apparatus D.

In some other embodiments, referring to FIG. 13, the visible light communication device further includes the illuminant, and the visible light communication device may transmit the optical signal containing the information through the illuminant (flashlight, breathing light, etc.). In this case, the visible light communication device may further include a third processing device M3, and the third processing device M3 is configured to control the illuminant to transmit the optical signal containing the information.

In yet other embodiments, referring to FIG. 13, the visible light communication device includes the second processing device M2, the illuminant and the third processing device M3.

Figure 14:
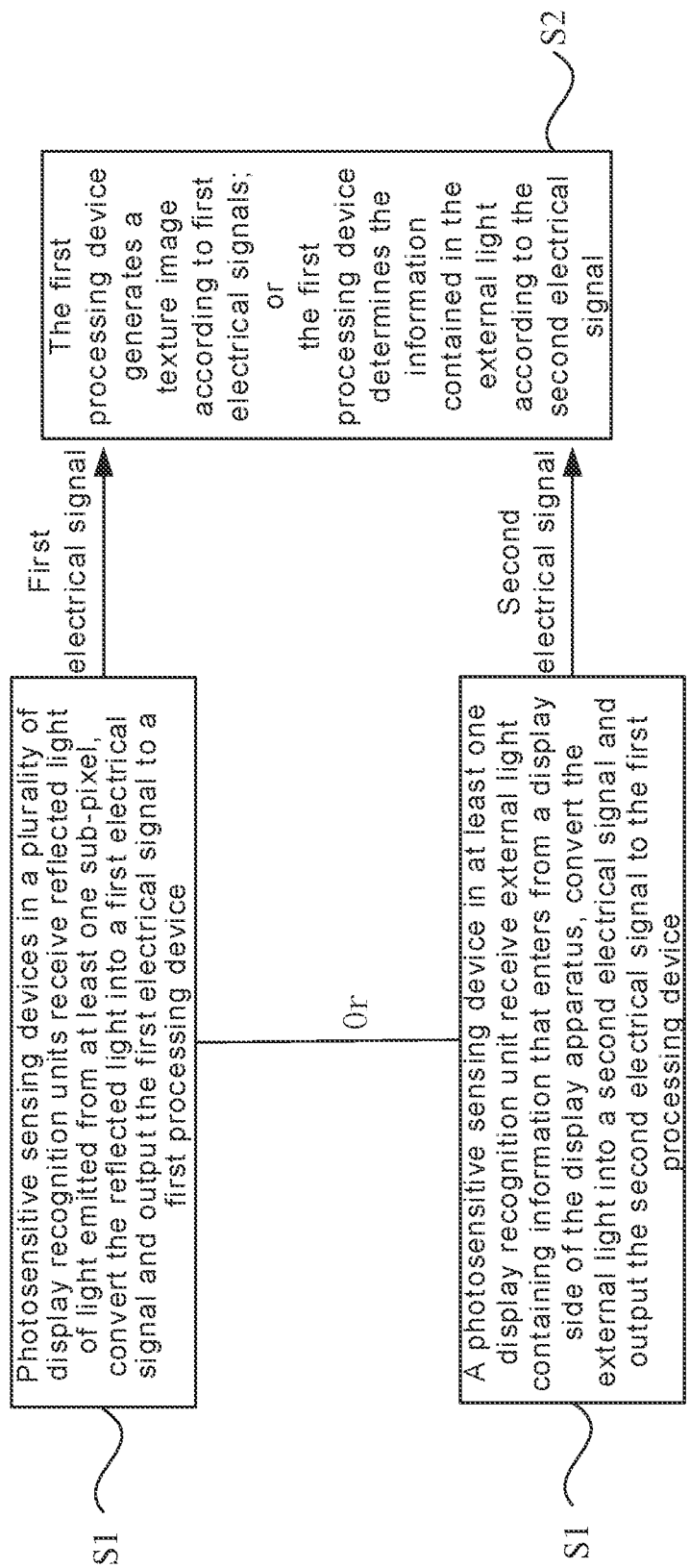
FIG. 14 is a flow diagram of a signal recognition method of a display apparatus provided by embodiments of the present disclosure.

Referring to FIG. 14, the present disclosure further provides a signal recognition method of the display apparatus according to any one of the above embodiments, which includes the following steps.

In S1, photosensitive sensing devices in a plurality of (e.g., each of) display recognition units receive reflected light of light emitted from at least one sub-pixel, convert the reflected light into a first electrical signal, and output the first electrical signal to a first processing device;
alternatively,
a photosensitive sensing device in at least one (e.g., each) display recognition unit receives external light containing information that enters from a display side of the display apparatus, converts the external light into a second electrical signal, and outputs the second electrical signal to the first processing device.

In S2, the first processing device receives first electrical signals output by the plurality of photosensitive sensing devices, and generates a texture image according to the first electrical signal; alternatively, the first processing device determines the information contained in the external light according to the second electrical signal output by at least one photosensitive sensing device.

The first processing device determines the information contained in the external light according to the second electrical signal output by the at least one photosensitive sensing device, which means that, the first processing device may determine the information contained in the external light according to a magnitude and/or a frequency of the second electrical signal output by the at least one photosensitive sensing device.

The signal recognition method of the display apparatus has the same beneficial effects as the above display apparatus D, which will not be repeated herein.

Optionally, the display apparatus includes a backlight module.

The photosensitive sensing device in each display recognition unit receiving the reflected light of the light emitted from the at least one sub-pixel includes: in a case where the backlight module is turned on, the photosensitive sensing devices in the plurality (e.g., each) of display recognition units 10 receiving the reflected light of the light emitted from the at least one sub-pixel.

In a case where the backlight module is turned on, sub-pixel(s) in each display recognition unit may emit light, so that fingerprint recognition may be performed.

The photosensitive sensing device in each display recognition unit receiving the external light that enters from the display side of the display apparatus includes: in a case where the backlight module is turned off, the photosensitive sensor in the at least one (e.g., the plurality of) display recognition unit receiving the external light that enters from the display side of the display apparatus.

When the display apparatus is used for visible light communication, only the external light is required, so the backlight module may be turned off. Interference of the light provided by the backlight module in the external light may be avoided, moreover, the power consumption of the display apparatus may be saved.

Those skilled in the art can understand that, the light, the optical signals, and the light rays involved in the present disclosure may be understood as optical signals; connections and electrical connections involved in the present disclosure may be understood as electrical connections or couplings.

Those skilled in the art can understand that, the present application ignores light existing in the environment when the display apparatus is operating in the fingerprint recognition mode or the visible light operating mode, and this ambient light may also enter the display apparatus. However, since an intensity of the ambient light is relatively weak, an influence of the ambient light is not considered.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:
1. A display apparatus, comprising:
a plurality of display recognition units, each display recognition unit of the display recognition units including one or more sub-pixels and a photosensitive sensing device, wherein the photosensitive sensing device is configured to convert reflected light of light emitted from at least one sub-pixel into a first electrical signal, and is further configured to convert external light containing information that enters from a display side of the display apparatus into a second electrical signal; and a first processing device connected to a plurality of photosensitive sensing devices of the plurality of display recognition units; the first processing device being configured to obtain a texture image according to first electrical signals output by the plurality of photosensitive sensing devices, and the first processing device being further configured to determine the information contained in the external light according to a second electrical signal output by at least one photosensitive sensing device.

2. The display apparatus according to claim 1, wherein the first processing device is configured to determine the information contained in the external light according to a magnitude and/or a frequency of the second electrical signal.

3. The display apparatus according to claim 1, wherein the first processing device is further configured to determine whether an electrical signal received thereby is the first electrical signal or the second electrical signal according to a preset threshold interval.

4. The display apparatus according to claim 1, wherein the plurality of display recognition units are arranged at intervals; or
a display recognition unit of the display recognition units includes a plurality of sub-pixels, and a part of the plurality of sub-pixels is shared by another display recognition unit of the display recognition units.

5. The display apparatus according to claim 1, wherein the photosensitive sensing device includes one photosensitive sensor, the photosensitive sensor is configured to convert the reflected light of the light emitted from the at least one sub-pixel into the first electrical signal, and is further configured to convert the external light entering from the display side of the display apparatus into the second electrical signal; or
the photosensitive sensing device includes two photosensitive sensors; one photosensitive sensor of the two photosensitive sensors is configured to convert the reflected light of the light emitted from the at least one sub-pixel into the first electrical signal, and another photosensitive sensor of the two photosensitive sensors is configured to convert the external light entering from the display side of the display apparatus into the second electrical signal.

6. The display apparatus according to claim 5, wherein the display recognition unit includes a plurality of sub-pixels; and
in a case where the photosensitive sensing device includes the two photosensitive sensors, the another photosensitive sensor of the two photosensitive sensors includes a plurality of photosensitive elements, wherein
the plurality of photosensitive elements are in one-to-one correspondence with at least two sub-pixels of the sub-pixels in the display recognition unit, or the plurality of photosensitive elements are in one-to-one correspondence with at least one sub-pixel of the sub-pixels in the display recognition unit and the one photosensitive sensor of the two photosensitive sensors.

7. The display apparatus according to claim 6, wherein the display recognition unit includes at least three different colors of sub-pixels.

8. The display apparatus according to claim 1, further comprising: a plurality of first gate lines, a plurality of second gate lines, a plurality of third gate lines, one or more first output signal lines, and one or more second output signal lines;
the photosensitive sensing device includes one photosensitive sensor, the photosensitive sensor is connected to a first gate line of the first gate lines and a first output signal line of the one or more first output signal lines, and a sub-pixel of the one or more sub-pixels is connected to a second gate line of the second gate lines; or
the photosensitive sensing device includes two photosensitive sensors, one photosensitive sensor of the two photosensitive sensors is connected to a first gate line of the first gate lines and a first output signal line of the one or more first output signal lines, another photosensitive sensor of the two photosensitive sensors is connected to a third gate line of the third gate lines and a second output signal line of the one or more second output signal lines, and a sub-pixel of the one or more sub-pixels is connected to a second gate line of the second gate lines.

9. The display apparatus according to claim 1; further comprising: a substrate, wherein
a sub-pixel of the one or more sub-pixels includes a light-emitting device, and the light-emitting device and the photosensitive sensing device are disposed on a same side of the substrate.

10. The display apparatus according to claim 9, wherein the photosensitive sensing device include a photosensitive sensing layer; and
the light-emitting device includes a light-emitting functional layer, wherein
the light-emitting functional layer and the photosensitive sensing layer in the photosensitive sensing device are located on a same layer.

11. The display apparatus according to claim 9, further comprising: first light-shielding patterns, wherein
a first light-shielding pattern of the first light-shielding patterns and the photosensitive sensing device are located on a same surface of the substrate, and an orthographic projection of the first light-shielding pattern on the substrate is located between an orthographic projection of the light-emitting device on the substrate and an orthographic projection of the photosensitive sensing device on the substrate; and
a distance between a surface of the first light-shielding pattern proximate to the substrate and the surface of the substrate is less than or equal to a distance between a surface of the light-emitting functional layer of the light-emitting device proximate to the substrate and the surface of the substrate; and a distance between a surface of the first light-shielding pattern away from the substrate and the surface of the substrate is greater than or equal to a distance between a surface of the light-emitting functional layer of the light-emitting device away from the substrate and the surface of the substrate.

12. The display apparatus according to claim 11, further comprising: second light-shielding patterns, wherein
a second light-shielding pattern of the second light-shielding patterns is disposed on a side of the first light-shielding pattern away from the substrate, and an orthographic projection of the second light-shielding pattern on the substrate is located between the orthographic projection of the photosensitive sensing device on the substrate and the orthographic projection of the light-emitting device on the substrate.

13. The display apparatus according to claim 1, further comprising: a backlight module, wherein
the backlight module is configured to provide a light source for the one or more sub-pixels, so that the photosensitive sensing device receives the reflected light of the light emitted from the at least one sub-pixel, and the backlight module is further configured to stop providing the light source for the one or more sub-pixels during a process of receiving the external light entering from the display side of the display apparatus by the photosensitive sensing device.

14. The display apparatus according to claim 13, further comprising:
a substrate; and
third light-shielding patterns, wherein
a third light-shielding pattern of the third light-shielding patterns is disposed between the substrate and the photosensitive sensing device, and an orthographic projection of the photosensitive sensing device on the substrate is within an orthographic projection of the third light-shielding pattern on the substrate.

15. A visible light communication device, comprising the display apparatus according to claim 1.

16. The visible light communication device according to claim 15, further comprising:
a second processing device configured to control at least one display recognition unit in the display apparatus to transmit an optical signal containing information; and/or
an illuminant and a third processing device, the third processing device being configured to control the illuminant to transmit another optical signal containing information.

17. The visible light communication device according to claim 15, wherein the visible light communication device is a communication terminal or a lock body.

18. A signal recognition method of a display apparatus, comprising:
receiving, by each photosensitive sensing device of a plurality of photosensitive sensing devices in a plurality of display recognition units, reflected light of light emitted from at least one sub-pixel, converting, by the photosensitive sensing device, the reflected light into a first electrical signal, and outputting, by the photosensitive sensing device, the first electrical signal to a first processing device; or receiving, by a photosensitive sensing device in at least one display recognition unit of the display recognition units, external light containing information that enters from a display side of the display apparatus, converting, by the photosensitive sensing device, the external light into a second electrical signal, and outputting, by the photosensitive sensing device the second electrical signal to a first processing device; and
receiving, by the first processing device, first electrical signals output by the plurality of photosensitive sensing devices, and generating, by the first processing device, a texture image according to the first electrical signals; or determining, by the first processing device, the information contained in the external light according to the second electrical signal output by the photosensitive sensing device.

19. The signal recognition method of the display apparatus according to claim 18, wherein the display apparatus includes a backlight module;
if the backlight module is turned on, the photosensitive sensing devices in the plurality of display recognition units each receive the reflected light of the light emitted from the at least one sub-pixel; and
if the backlight module is turned off, the photosensitive sensing device in the at least one display recognition unit receives the external light entering from the display side of the display apparatus.

* * * * *